United States Patent
Mizuuchi et al.

(10) Patent No.: US 7,643,524 B2
(45) Date of Patent: Jan. 5, 2010

(54) SURFACE-EMITTING LASER AND LASER PROJECTOR

(75) Inventors: Kiminori Mizuuchi, Osaka (JP); Ken'ichi Kasazumi, Osaka (JP); Akihiro Morikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 455 days.

(21) Appl. No.: 10/584,077

(22) PCT Filed: Dec. 21, 2004

(86) PCT No.: PCT/JP2004/019060

§ 371 (c)(1), (2), (4) Date: Jun. 22, 2006

(87) PCT Pub. No.: WO2005/062434

PCT Pub. Date: Jul. 7, 2005

(65) Prior Publication Data

US 2008/0232412 A1    Sep. 25, 2008

(30) Foreign Application Priority Data

Dec. 22, 2003  (JP)  ............................. 2003-425601

(51) Int. Cl.
*H01S 3/00* (2006.01)
(52) U.S. Cl. .............................. 372/38.05; 372/29.013; 372/87; 372/46.01
(58) Field of Classification Search .............. 372/46.01, 372/46.013–46.016, 29.013, 38.05, 87
See application file for complete search history.

(56) References Cited

U.S. PATENT DOCUMENTS 5,343,487 A    8/1994   Scott et al.
5,745,515 A *  4/1998   Marta et al. ............. 372/45.013
6,404,797 B1   6/2002   Mooradian
6,639,290 B1 * 10/2003   Hohe et al. .................. 257/421

(Continued)

FOREIGN PATENT DOCUMENTS

JP    57157576    *  9/1982

(Continued)

OTHER PUBLICATIONS

Chinese Office Action issued Jul. 17, 2007 in the corresponding Chinese patent application.

*Primary Examiner*—Minsun Harvey
*Assistant Examiner*—Tod T Van Roy
(74) *Attorney, Agent, or Firm*—Wenderoth, Lind & Ponack L.L.P.

(57) ABSTRACT

A surface emitting laser includes an active layer disposed on a semiconductor substrate, and a pair of upper and lower electrodes for injecting carriers into the active layer. The plane surface of the lower electrode is shaped into a star so that injection of current into the active layer from the lower electrode is carried out with a high density at the center of the lower electrode and with a low density at its periphery part. In the surface emitting laser, the density distribution of the carriers injected into the active layer corresponds to the power distribution of light inside the active layer. Thereby, hole burning due to an increase in the current density in the region of the active layer corresponding to the peripheral part of the electrode is avoided, and the transverse mode stability during high output operation is significantly enhanced to improve high-output characteristic.

18 Claims, 11 Drawing Sheets

U.S. PATENT DOCUMENTS

| | | |
|---|---|---|
| 2004/0080811 A1 | 4/2004 | Shimizu et al. |
| 2005/0145870 A1* | 7/2005 | Shakuda et al. ............... 257/99 |
| 2008/0230792 A1* | 9/2008 | Jiang et al. .................... 257/94 |

FOREIGN PATENT DOCUMENTS

| | | |
|---|---|---|
| JP | 2-52485 | 2/1990 |
| JP | 7-321405 | 12/1995 |
| JP | 9-260763 | 10/1997 |
| JP | 11-068225 | 3/1999 |
| JP | 11-233889 | 8/1999 |
| JP | 2001-502119 | 2/2001 |
| JP | 2002-185078 | 6/2002 |
| JP | 2003-324246 | 11/2003 |
| WO | 98/43329 | 10/1998 |

\* cited by examiner

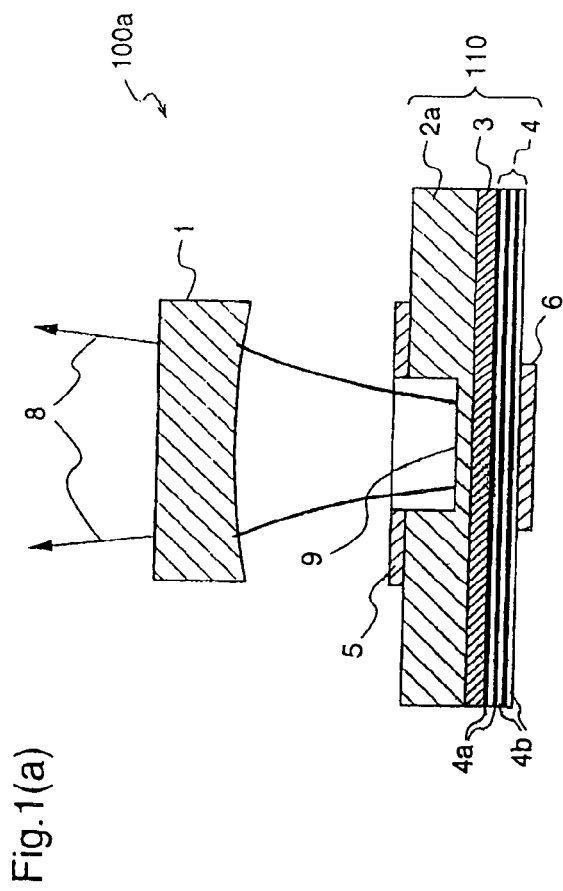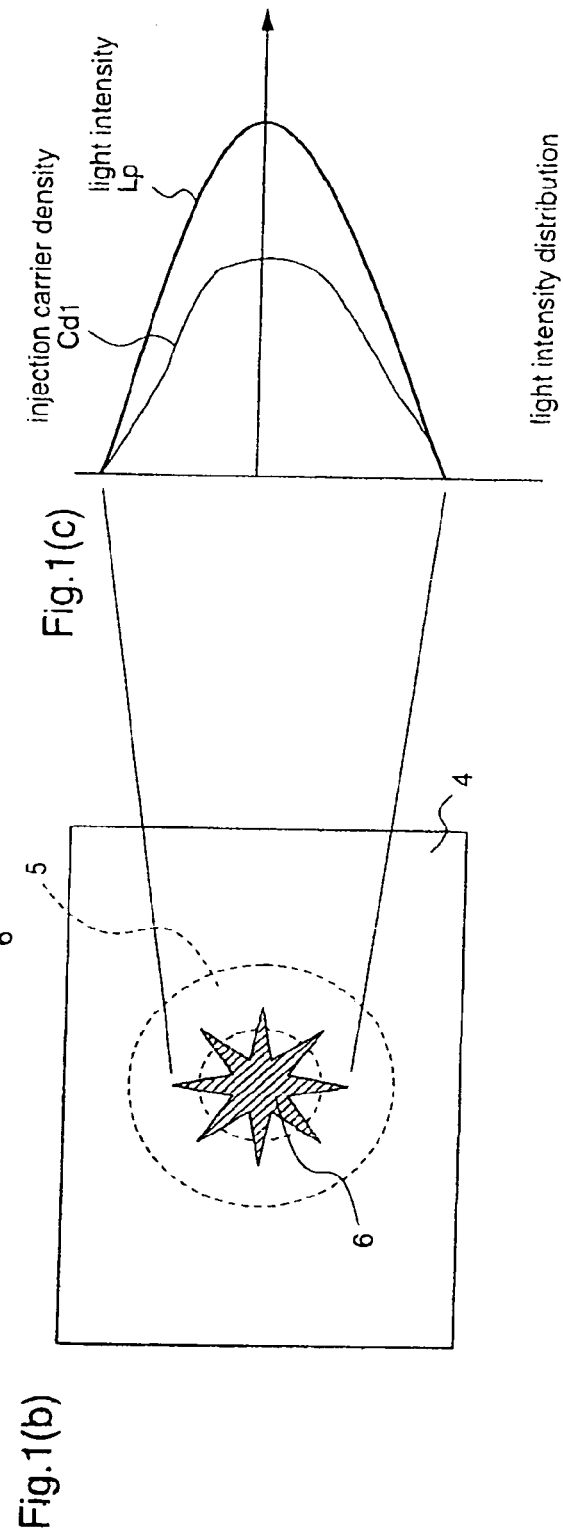

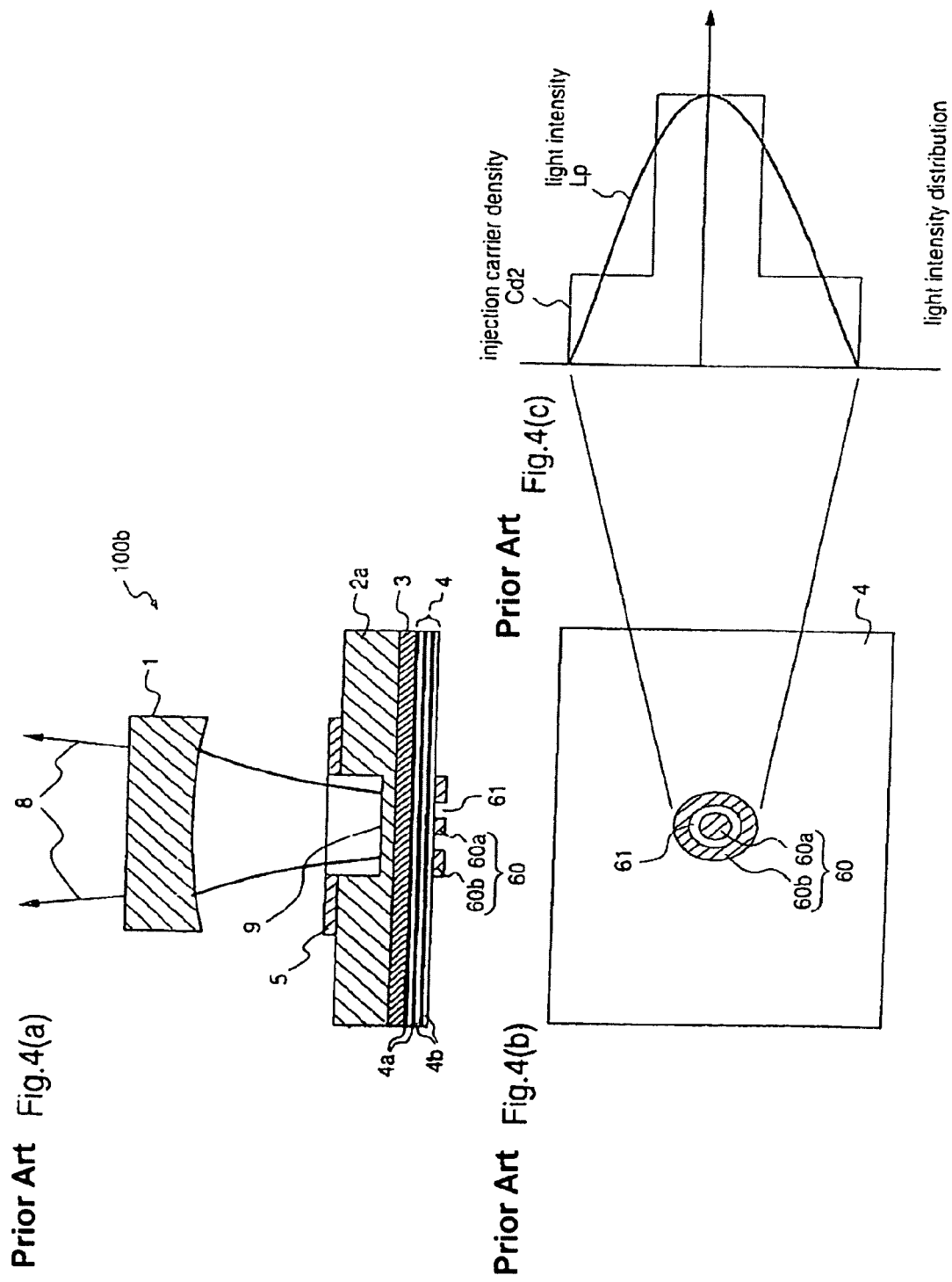
Prior Art Fig.4(a)
Prior Art Fig.4(b)
Prior Art Fig.4(c)

SURFACE-EMITTING LASER AND LASER PROJECTOR

BACKGROUND OF THE INVENTION

I. Technical Field

The present invention relates to a surface emitting laser and a laser projector, and more particularly, to a surface emitting laser that operates stably at high output power, and a laser projector using the surface emitting laser as a light source.

II. Description of the Related Art

A surface emitting laser is a semiconductor laser that oscillates with a low threshold and has a superior beam quality, and applications of the surface emitting laser to an optical communication field are realized, utilizing the modulation characteristic that can modulate output light at a high speed. However, a problem with surface emitting lasers is the difficulty in realizing high output power.

Since a surface emitting laser is composed of thin films, a resonator length thereof is quite short because of its structure. Therefore, it is difficult to obtain a sufficient gain by increasing the resonator length.

On the other hand, high output power can be obtained by increasing a driving current of the surface emitting laser. However, when the carrier density in an active layer is too high in the surface emitting laser, light output is saturated due to gain saturation caused by spatial hole burning, and thereby high output operation is prevented.

Therefore, increasing the beam cross-section in the surface emitting laser is effective to achieve high output power of the surface emitting laser without increasing the resonator length or the driving current.

In the surface emitting laser having a short resonator length, however, when the beam cross-section is increased to increase the output power of the laser, the transverse mode in the resonator undesirably becomes multimode, leading to significant reductions in beam quality and oscillation efficiency.

Meanwhile, a surface emitting laser which prevents such reductions in beam quality and oscillation efficiency has already been developed. For example, U.S. Pat. No. 6,404,797 (the '797 patent) discloses a surface emitting laser in which the beam cross-section is increased while preventing the transverse mode from becoming multimode.

FIG. 14 is a diagram for explaining the surface emitting laser disclosed in the '797 patent, and specifically, FIG. 14($a$) is a cross-sectional view thereof, FIG. 14($b$) shows the shape of a lower electrode, and FIG. 14($c$) shows a light intensity distribution in a region of an active layer of this surface emitting laser, which region is opposed to the lower electrode.

The surface emitting laser 200 shown in FIG. 14($a$) includes a semiconductor substrate 2, an active layer 3 disposed on one surface of the semiconductor substrate 2, and a reflection layer 4 disposed on the active layer 3. The reflection layer 4 is a distributed Bragg reflection layer obtained by alternately laminating materials 4$a$ and 4$b$ having different refractive indexes, and hereinafter, it is referred to also as a DBR layer. Further, the surface emitting laser 200 includes a circular lower electrode 600 disposed at the surface of the DBR layer 4, and an annular upper electrode 5 which is disposed on the other surface of the substrate 2 so as to surround the region opposed to the lower electrode 600.

The surface emitting laser 200 further includes an external mirror 1 which is disposed above the surface electrode 5 so as to be opposed to the surface of the substrate inside the surface electrode 5. In the surface emitting laser 200, a resonator for amplifying light generated in the active layer 3 to generate laser oscillation is constituted by the DBR layer 4 and the external mirror 1. The DBR layer 4 is a total reflection layer, and the external mirror 1 is a partial transmission mirror.

Next, the operation will be described.

In the surface emitting laser 200, when a driving voltage is applied between the upper electrode 5 and the lower electrode 600 and a current is injected into the active layer 3, light is generated in the active layer 3, and the generated light is amplified by the resonator. When the magnitude of the injected current exceeds a predetermined value (i.e., a laser oscillation threshold), laser oscillation occurs in the resonator, and laser light 8 is emitted through the external mirror 1 to the outside. At this time, the laser light 8 is surface-emitted, and the emission direction thereof is perpendicular to the surface of the substrate 2.

As described above, in the surface emitting laser disclosed in the '797 patent, a mirror as one of the components of the resonator is disposed separately from the substrate as the external mirror 1, thereby to increase the resonator length.

To be specific, since the external mirror 1 is used, the resonance mode can be kept in single mode even when the beam cross-section is increased, thereby realizing a high-output characteristic.

Further, Japanese Published Patent Application No. Hei. 11-233889 (the '889 application) discloses an electrode structure for uniformizing the carrier density in an active layer in a surface emitting laser.

In the surface emitting laser disclosed in the '889 application, distribution of current to be injected into the active layer is controllable by dividing a rear electrode into plural parts, thereby realizing a large-aperture surface emitting laser.

In the surface emitting laser 200 disclosed in the '889 application, the carrier density distribution in the active layer becomes a problem in realizing high-output characteristic. That is, in the surface emitting laser 200 disclosed in this document, the light intensity distribution in the region of the active layer 3 opposed to the lower electrode 600 is close to Gaussian distribution as shown in FIG. 14($c$), and a peak of the light intensity Lp exists at the emission center of the active layer. On the other hand, in the region of the active layer 3 opposed to the lower electrode 600, the density Cd of carriers injected into the active layer 3 is uniform although the light intensity distribution significantly differs between the center portion of this region and the peripheral portion thereof. Therefore, in the peripheral portion of the center portion of the region of the active layer 3 opposed to the lower electrode 600, the density of carriers existing in the active layer is high, whereby an excess of carriers occurs. On the other hand, in the center portion of this region, shortage of carriers occurs. Such uneven distribution of carriers causes refractive-index distribution in the active layer 3, whereby the resonance mode undesirably becomes multimode. Further, there is a fear of gain saturation.

This phenomenon is more remarkable in a nitride-base semiconductor laser in which the threshold carrier density at which gain saturation occurs is extremely high and the differentiation gain is also high, than in an infrared semiconductor laser comprising AlGaAs system semiconductor material ($Al_xGa_{1-x}As$ ($0 \leqq =x \leqq 1$)) and a red semiconductor laser comprising AlGaInP system semiconductor material ($Al_xGa_yIn_{1-x-y}P$ ($0 \leqq x \leqq 1$, $0 \leqq y \leqq 1$)).

Further, in the surface emitting laser disclosed in the '889 application, loss occurs in the current injected into the active layer due to a resistive separation layer disposed in the part where the rear electrode is divided into plural parts, leading to a reduction in efficiency.

SUMMARY OF THE INVENTION

The present invention solves the above-described problems and has for its object to provide a high-output surface emitting laser that can perform laser oscillation with a stable transverse mode, and that can perform current injection into an active layer with efficiency, as well as a laser projector using such high-output surface emitting laser as a light source.

In order to solve the above-mentioned problems, according to one aspect of the present invention, a surface emitting laser performing surface emission of laser light comprises an active layer disposed on a semiconductor substrate; and a pair of electrodes for injecting carriers into the active layer; wherein one of said electrodes comprises a single electrode layer, and injection of current from said one electrode into the active layer is carried out with different current densities for a center portion of said one electrode and for a peripheral portion thereof.

Therefore, the density distribution of the carriers injected into the active layer can be adjusted in accordance with the light intensity distribution in the active layer to make the carrier distribution in the active layer uniform. As a result, it is possible to realize a surface emitting laser having excellent high-output characteristic, in which the stability of the transverse mode during high-output operation is significantly increased.

According to another aspect of the present invention, the surface emitting laser also includes a semiconductor layer laminated body including the active layer, which is obtained by laminating plural semiconductor layers on the semiconductor substrate; wherein the area density in a region where the electrode layer contacts the semiconductor layer laminated body differs between the center portion of the electrode layer and the periphery portion thereof.

Therefore, the density distribution of the carriers injected into the active layer can be adjusted by the area of the region where the electrode layer contacts the semiconductor layer laminated body, whereby uniformization of the carrier distribution in the active layer having the light intensity distribution can be realized by a simple method such as changing the shape of the electrode layer.

According to another aspect of the present invention, in the surface emitting laser, plural fine holes are formed in the electrode layer constituting said one electrode so that the occupation density of the fine holes differs between the center portion of said one electrode and the peripheral portion thereof.

Therefore, the density distribution of the carriers injected into the active layer can be adjusted by changing the arrangement of the plural fine holes formed in the electrode layer or the sizes of the fine holes, whereby uniformization of the carrier distribution in the active layer having the light intensity distribution can be realized by simple modification of the structure of the electrode layer. Moreover, heat radiation effect from the electrode layer to the heat sink can be further enhanced by increasing the broadening of the whole electrode layer on the semiconductor layer, resulting in a surface emitting laser having excellent high-output characteristic.

According to another aspect of the present invention, in the surface emitting laser, the resistance value of the electrode layer constituting said one electrode differs between the center portion of said one electrode and the peripheral portion thereof.

Therefore, the density distribution of the carriers injected into the active layer can be adjusted more precisely in accordance with the light intensity distribution in the active layer, by changing the material or component of the electrode layer to change the resistance value of the electrode layer.

According to another aspect of the present invention, the surface emitting laser further includes a semiconductor layer laminated body including the active layer, which is obtained by laminating plural semiconductor lasers on the semiconductor substrate; and a resistive layer disposed between the semiconductor layer laminated body and the electrode layer constituting said one electrode; wherein the resistance value of the resistive layer differs between a portion corresponding to the center portion of said one electrode and a portion corresponding to the peripheral portion of said one electrode.

Therefore, the density distribution of the carriers injected into the active layer can be adjusted more precisely in accordance with the light intensity distribution in the active layer, by changing the material or component of the resistive layer.

According to another aspect of the present invention, the surface emitting laser further includes a semiconductor layer laminated body including the active layer, which is obtained by laminating plural semiconductor layers on the semiconductor substrate; and a resonator for amplifying the light generated in the active layer to generate laser oscillation, said resonator comprising a reflection layer included in the semiconductor layer laminated body, and an external mirror disposed separately from the semiconductor layer laminated body so as to be opposed to the reflection layer.

Therefore, the resonator length in the surface emitting laser can be increased, and the beam cross section can be increased while preventing the transverse mode in the resonator from becoming multimode, whereby the high-output characteristic of the surface emitting laser can be dramatically improved.

According to another aspect of the present invention, in the surface emitting laser, said external mirror is a partial transmission mirror both surfaces of which are concave in shape.

Therefore, the spread angle of the laser light emitted from the surface emitting laser is increased, and a versatile lens having a large aperture and a short focal distance can be used as an optical system for connecting the surface emitting laser to an optical fiber or the like, whereby an inexpensive and compact optical system having a short optical path length can be adopted.

According to another aspect of the present invention, the surface emitting laser includes a semiconductor layer laminated body including said active layer, which is obtained by laminating plural semiconductor layers on the semiconductor substrate; and said semiconductor layer laminated body includes an over-saturation absorber for absorbing over-saturated carriers in the active layer, said absorber being disposed in the vicinity of the active layer.

Therefore, the surface emitting laser can be put into a self-excitation state utilizing a phenomenon that over-saturated carriers are absorbed, that is, an oscillation state where the laser emits laser light in pulses although a DC current is applied to the laser, thereby reducing speckle noise.

According to another aspect of the present invention, in the surface emitting laser, the oscillation wavelength of the surface-emitted laser light is within a range of 430~455 nm.

Therefore, it is possible to obtain a blue surface emitting laser that realizes low power consumption due to a reduction in required power as well as high color-reproducibility.

According to another aspect of the present invention, in the surface emitting laser, the oscillation wavelength of the surface-emitted laser light is within a range of 630~650 nm.

Therefore, it is possible to obtain a red surface emitting laser that realizes high output power.

According to another aspect of the present invention, in the surface emitting laser, the oscillation wavelength of the surface-emitted laser light is within a range of 510~550 nm.

Therefore, it is possible to obtain a green surface emitting laser with high reliability.

According to another aspect of the present invention, the surface emitting laser includes a non-linear optical member for converting the wavelength of laser light, said optical member being disposed between the external mirror and the active layer.

Therefore, it is possible to realize a high-output laser light source capable of generating short-wavelength light.

According to another aspect of the present invention, the surface emitting laser includes a semiconductor layer laminated body including the active layer, which is obtained by laminating plural semiconductor layers on the surface of the semiconductor substrate; and the semiconductor substrate has a concave part which is formed by etching a portion of the substrate at its rear surface, up to a position near the surface of the active layer.

Therefore, absorption of the laser light in the semiconductor substrate is reduced, thereby achieving high-power output.

According to another aspect of the present invention, there is provided a semiconductor laser device comprising a semiconductor laser for emitting laser light, and a wavelength conversion element for converting the wavelength of the laser light emitted from the semiconductor laser, and the semiconductor laser is the surface emitting laser defined above.

Therefore, it is possible to realize a high-output semiconductor laser capable of generating short-wavelength light, which changes the wavelength of the laser light from the surface emitting laser, and outputs the laser light.

According to another aspect of the present invention, there is provided a laser module obtained by integrating plural semiconductor lasers in a single package, and each of the plural semiconductor lasers is the surface emitting laser defined above.

Therefore, a multi-wavelength light source such as an RGB light source can be realized, and further, an ultracompact laser irradiation device can be realized by using such multi-wavelength light source and a focusing optical system.

According to another aspect of the present invention, in the laser module, the plural semiconductor lasers are arranged so that each semiconductor laser is positioned at an apex of a regular polygon the center of which matches the center of the package.

Therefore, the package structure is simplified for cost reduction, and high power output and long life of the laser module can be realized.

According to another aspect of the present invention, there is provided a laser projector comprising a semiconductor laser for emitting laser light, and a projection optical system for projecting the laser light emitted from the semiconductor laser, and the semiconductor laser is the surface emitting laser defined above.

Therefore, it is possible to realize an ultracompact laser projector capable of high power output, in which the transverse mode stability during high output operation is significantly improved.

According to another aspect 8 of the present invention, in the laser projector, the surface emitting laser emits laser light in which a vertical mode spectrum is in a multimode.

Therefore, coherence of the laser light is reduced, leading to a reduction in speckle noise.

According to another aspect of the present invention, in the laser projector, the surface emitting laser emits laser light in which the substantial width of a vertical mode spectrum is 1 nm or more.

Therefore, a laser projector with significantly reduced speckle noise is realized.

According to another aspect of the present invention, there is provided a surface emitting laser performing surface emission of laser light comprising an active layer disposed on a semiconductor substrate; and a pair of electrodes for injecting carriers into the active layer; wherein one of said electrodes is divided into plural electrode parts, and a laser driving voltage on which a radio frequency component is superposed is applied to at least one of the plural electrode parts.

Therefore, the densities of the carriers injected into the active layer from the respective electrode parts can be adjusted by the driving voltages applied to the respective electrode parts, whereby the carrier density in the active layer is made uniform regardless of the light intensity distribution in the active layer, resulting in a surface emitting laser having excellent high-output characteristic, in which the transverse mode stability during high-output operation is significantly improved. Further, since the laser driving voltage on which the radio frequency component is superposed is applied to the electrode part, the state of laser oscillation varies and the temporal coherence of the laser light is reduced, whereby noise due to return light can be reduced.

According to another aspect of the present invention, in the surface emitting laser, the divided plural electrode parts are arranged substantially uniformly around the emission center of the laser light.

Therefore, the driving voltages of the same level are applied to the electrode parts which are equally distant from the emission center, whereby the carrier density can be easily made uniform in the active layer wherein the light intensity distribution varies.

According to another aspect of the present invention, in the surface emitting laser, injection of current from each electrode part to the active layer is carried out so that the current density increases toward a region near the emission center of the active layer.

Therefore, it is possible to realize, in the active layer having the light intensity distribution in which a peak of the light intensity is positioned in the emission center, a density distribution of injected carriers which is suited to the light intensity distribution.

According to another aspect of the present invention, in the surface emitting laser, a modulated laser driving voltage is applied to at least one of the plural electrode parts.

Therefore, it is possible to reduce speckle noise by a reduction in coherence, while relaxing a chirping phenomenon in which the oscillation wavelength varies.

According to another aspect of the present invention, in the surface emitting laser, plural semiconductor laser parts constituted by the respective electrode parts are driven with different injection currents.

Therefore, a carrier injection density corresponding to the light intensity distribution can be realized in an active layer corresponding to each semiconductor laser, whereby high power output of the surface emitting laser can be achieved while reducing spatial hole burning.

According to another aspect of the present invention, the surface emitting laser includes a semiconductor layer laminated body including the active layer, which is obtained by laminating plural semiconductor layers on the surface of the semiconductor substrate; and the semiconductor substrate has a concave part that is formed by etching a portion of the substrate at its rear surface, up to a position near the surface of the active layer.

Therefore, absorption of the laser light in the semiconductor substrate can be reduced, thereby achieving high power output.

According to the present invention, in the surface emitting laser, the density distribution of carriers injected into the active layer of the surface emitting laser is adjusted in accordance with the light power distribution in the active layer, whereby occurrence of hole burning due to an increase in the current density in a region of the active layer corresponding to the peripheral part of the electrode is avoided, whereby stability of the transverse mode during high output operation is significantly improved to enhance the high-output characteristic.

As a result, it is possible to provide a high-output surface emitting laser which can perform laser oscillation with a stable transverse mode, and which can efficiently perform injection of current into the active layer, as well as a laser projector using the high-output surface emitting laser as a light source.

BRIEF DESCRIPTION OF THE DRAWINGS

FIG. 1 is a diagram illustrating a surface emitting laser according to a first embodiment of the present invention, illustrating a cross-sectional structure thereof (1(a)), the shape of a lower electrode (1(b)), and a light intensity distribution in an emission region of an active layer (1(c)).

FIG. 4 is a diagram illustrating a surface emitting laser according to a second embodiment of the present invention, illustrating a cross-sectional structure thereof (4(a)), the shape of a lower electrode (4(b)), and a light intensity distribution in an emission region of an active layer (4(c)).

DETAILED DESCRIPTION OF THE INVENTION

Hereinafter, embodiments of the present invention will be described with reference to the drawings.

Embodiment 1

Figure 14C:
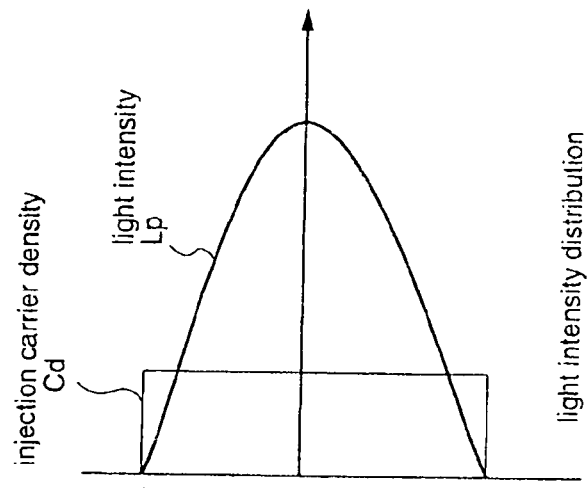
FIG. 14 is a diagram illustrating an example of a conventional surface emitting laser.
Figure 14A:
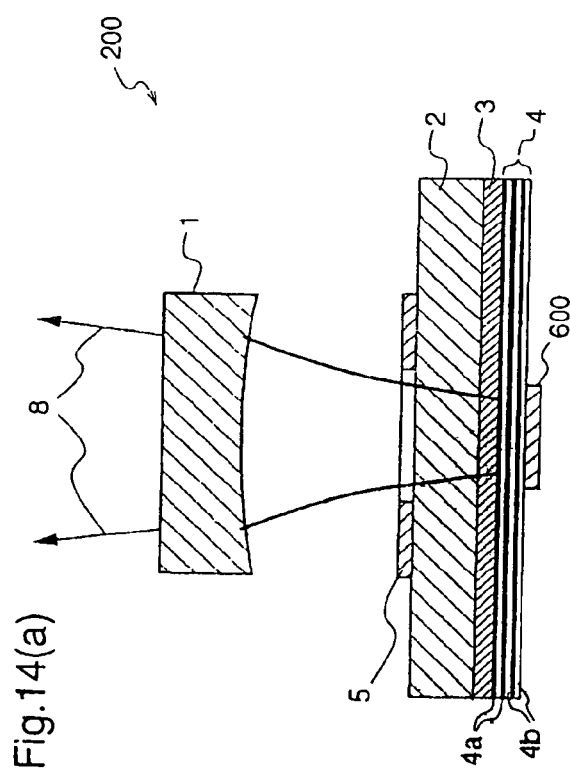
Figure 14B:
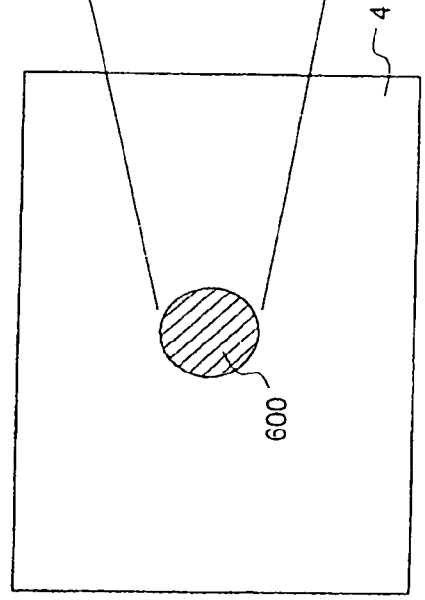

FIG. 1 is a diagram illustrating a surface emitting laser according to a first embodiment of the present invention, wherein FIG. 1(a) shows a cross-sectional structure thereof, FIG. 1(b) shows the shape of a lower electrode thereof, and FIG. 1(c) shows a light intensity distribution in an emission region of an active layer. In FIG. 1, the same reference numerals as those shown in FIG. 14 denote the same components as those of the conventional surface emitting laser.

The surface emitting laser 100a according to the first embodiment includes a semiconductor layer laminated body 110 obtained by depositing an active layer 3 and a reflection layer 4 on a front surface of a semiconductor substrate 2a; a lower electrode 6 fabricated in a predetermined region on the reflection layer 4; and a ring-shaped upper electrode 5 which is formed on a rear surface of the semiconductor substrate 2a.

The semiconductor substrate comprises a nitrogen compound containing GaN as a main component, and the active layer 3 comprises a nitride semiconductor containing GaN as a main component. The reflection layer 4 is a distributed Bragg reflector layer (hereinafter referred to as a DBR layer) obtained by alternately depositing materials 4a and 4b having different refractive indexes on the active layer 3.

In the surface emitting laser 100a according to the first embodiment, the lower electrode 6 is shaped into a star, which is obtained by cutting off, from an equilateral octagon, portions corresponding to isosceles triangles whose bases are the respective sides of the octagon. Accordingly, the area density in a part where the lower electrode 6 contacts the DBR layer 4 is high in the center portion of the lower electrode 6 and low in the peripheral portion of the lower electrode 6. The lower electrode 6 is arranged so that its center matches the center of the ring-shaped upper electrode 5, and the maximum width of the lower electrode 6 is larger than the inner diameter of the ring-shaped upper electrode 5 and smaller than the outer diameter of the ring-shaped upper electrode 5. Further, a portion of the semiconductor substrate 2a that is exposed at the inner side of the upper electrode 5 is etched up to a position near the surface of the active layer 3, and therefore, this portion is thinner than the other portion.

Further, the surface emitting laser 100a of the first embodiment has an external mirror 1 disposed above the ring-shaped upper electrode 5, and the external mirror 1 and the DBR layer 4 constitute a resonator for amplifying light generated in the active layer 3 so as to generate laser oscillation. The surface of the external mirror 1 on the substrate side is concave in shape.

Next, the function and effect will be described.

Initially, the laser oscillating operation of the surface emitting laser 100a according to the first embodiment will be briefly described.

In the surface emitting laser 100a, when a laser driving voltage is applied between the upper electrode 5 and the lower electrode 6, current is injected into the active layer 3. When the magnitude of the injected current exceeds a predetermined value (i.e., a laser oscillation threshold), laser oscillation occurs in the resonator, and laser light 8 is emitted through the external mirror 1 to the outside. At this time, the laser light 8 is surface-emitted, and the emission direction of the laser light is perpendicular to the surface of the semiconductor substrate 2a.

Next, the characteristics of the surface emitting laser according to the first embodiment will be described in comparison with those of the conventional surface emitting laser.

In the conventional surface emitting laser, the lower electrode is constituted by disposing a circular conductor layer on the DBR layer 4. Therefore, when the injection current is increased to obtain a higher power, the current density increases in the peripheral part of the electrode, whereby hole burning occurs, leading to reduction in gain and unstable transverse mode. Thus, increasing the injection current causes a reduction in output power and an unstable operation. On the other hand, in the center portion of the electrode, shortage of injection carriers occurs due to an increase in the light power density. Thus, in the conventional surface emitting laser, the transverse mode becomes multimode or the mode is destabilized during high output operation, resulting in difficulty in achieving a stable transverse mode.

On the other hand, in the surface emitting laser 100a according to the first embodiment, since the lower electrode 6 is shaped in a star as shown in FIG. 1(b), the density distribution of the carriers injected into the active layer 3 can be approximated to the intensity distribution of light in the active layer.

To be specific, as shown in FIG. 1(c), the light intensity Lp is highest at the emission center and gradually decreases toward the periphery, and thus the light intensity distribution in the active layer 3 is close to the Gaussian distribution. Accordingly, when the plane surface of the flower electrode 6 is shaped in a star as shown in FIG. 1(b), the area density in a part where the lower electrode 6 contacts the DBR layer 4 decreases from the center portion of the lower electrode toward the peripheral portion thereof. In other words, the density of current (carriers) injected into the active layer 3 from the lower electrode 6 becomes maximum in the center portion of the lower electrode 6 and decreases toward the peripheral portion, as shown in FIG. 1(c). As a result, the density distribution of current injected into the active layer 3 is adjusted to the light intensity distribution in the active layer 3, thereby realizing a surface emitting laser having excellent high output characteristic, in which the stability of the transverse mode during high output operation is significantly enhanced.

Further, a surface emitting laser in which an electrode is divided into plural parts to make distribution of injection carrier density adjustable has already been proposed. However, when the electrode of the surface emitting laser is divided, loss occurs in the current injected into the active layer due to a resistive separation layer located in the part where the electrode is divided, resulting in reduced efficiency. Further, since, in the divided plural electrodes, the injection carrier density distribution can be changed only discretely, matching between the injection carrier density distribution and the light intensity distribution is not sufficient. Furthermore, since laser driving voltages are applied to the respective electrodes so that currents of different current densities are injected into the active layer from the respective electrodes, the laser driving circuit is undesirably complicated.

On the other hand, in the surface emitting laser 100a according to the first embodiment, since the plane surface of the lower electrode 6 is shaped in a star, so that the area density in the part where the lower electrode 6 contacts the DBR layer 4 is higher in the center portion of the lower electrode 6 and lower in the peripheral portion of the lower electrode 6. Therefore, the injection carrier density distribution can be varied continuously, and further, a resistive separation layer for separating the electrodes, which is provided in the conventional surface emitting laser, is not needed, whereby efficient laser oscillation with less injection current loss can be carried out.

As described above, the first embodiment of the present invention is provided with the active layer 3 disposed on the semiconductor substrate 2a, and the upper electrode 5 and the lower electrode 6 for injecting carriers in the active layer 3, and the plane surface of the lower electrode 6 is shaped in a star so that injection of current from the lower electrode 6 to the active layer 3 is carried out at a high current density in the center portion of the lower electrode 6 and at a low current density in the peripheral portion thereof. Therefore, the density distribution of the carriers injected into the active layer 3 of the surface emitting laser can be adjusted to a distribution according to the power distribution of light in the active layer. Thereby, occurrence of hole burning due to an increase in the current density in the region of the active layer corresponding to the peripheral portion of the lower electrode 6 is avoided, resulting in a surface emitting laser having excellent high output characteristic, in which stability of the transverse mode during high output operation is significantly enhanced.

Further, in this first embodiment, since a region of the semiconductor substrate 2a which is opposed to the lower electrode 6 is thinned by etching the substrate up to a position near the surface of the active layer 3, it is possible to reduce absorption, by the semiconductor substrate 2a, of the laser light generated in a portion of the active layer 3 which is opposed to the lower electrode 6, whereby the laser light can be efficiently taken out from the rear surface of the semiconductor substrate 2a.

Further, in the structure where the laser light is taken out from the rear surface of the semiconductor substrate 2a, a metal electrode layer having a high thermal conductivity can be formed on a position close to the active layer, that is, the surface of the DBR layer 4 on the active layer 3. Further, the surface emitting laser may be constituted such that the above-mentioned metal electrode layer is adhered to a heat sink, whereby heat generated in the active layer 3 can be released to the outside with efficiency. As a result, temperature increases in the active layer 3 can be suppressed, leading to a further increase in the output power of the surface emitting laser.

Further, since in this first embodiment the resonator of the surface emitting laser 100a is composed of the DBR layer 4 disposed on the semiconductor substrate 2a and the external mirror 1 disposed separately from the semiconductor substrate 2a, a sufficient resonator length can be secured. Thereby, stability of the transverse mode of the resonator is enhanced, and the light intensity distribution in the active layer 3 in the vicinity of the lower electrode 6 is increased.

For example, the range of the light intensity distribution in the active layer is approximately proportional to the resonator length, and the resonator length can be increased by ten times or more when the external mirror 1 is used, whereby the effective area of the active layer can be increased. As a result, the high output characteristic of the surface emitting laser, which increases in proportion to the effective area of the active layer, can be enhanced dramatically.

Further, in the surface emitting laser having a large effective area of the active layer, in which the resonator is constituted using the external mirror, matching between the light intensity distribution and the injection carrier distribution in the active layer 3 is particularly important. However, in this first embodiment, since the plane surface of the lower electrode 6 of the surface emitting laser is shaped in a star, mismatching between the carrier density distribution and the light intensity distribution in the external mirror type surface emitting laser is resolved, and the high output characteristic of the surface emitting laser is significantly improved.

Further, in the surface emitting laser of the first embodiment, it is possible to reduce speckle noise by varying the oscillation wavelength in the oscillation state where laser light is outputted in pulses, although the laser is in the self-excited oscillation state utilizing over-saturated absorption, i.e., although the current applied to the semiconductor laser is DC current.

To be specific, in the surface emitting laser according to the first embodiment, since the plane surface of the lower electrode 6 is shaped such that the current injection into the active layer 3 from the lower electrode 6 is carried out with a high current density in the center portion of the lower electrode 6 and with a low current density in the peripheral portion thereof. Therefore, when an over-saturation absorber is provided on a portion of the active layer corresponding to the periphery of the lower electrode 6, wherein the injection current density is reduced, it is possible to reduce speckle noise by self-excited oscillation utilizing over-saturated absorption in the high-output surface emitting laser.

While in this first embodiment the plane surface of the lower electrode 6 is shaped in a star so that the area density in the part where the lower electrode 6 contacts the DBR layer 4 continuously changes from the center portion of the lower electrode 6 toward the peripheral portion thereof, the shape of the lower electrode 6 is not restricted thereto.

For example, the lower electrode 6 may have plural fine holes so that the area density in the portion where the lower electrode 6 contacts the DBR layer 4 differs between the center portion of the lower electrode 6 and the peripheral portion thereof.

FIG. 2 is a diagram illustrating an example of a lower electrode in which fine holes are formed.

Figure 2A:
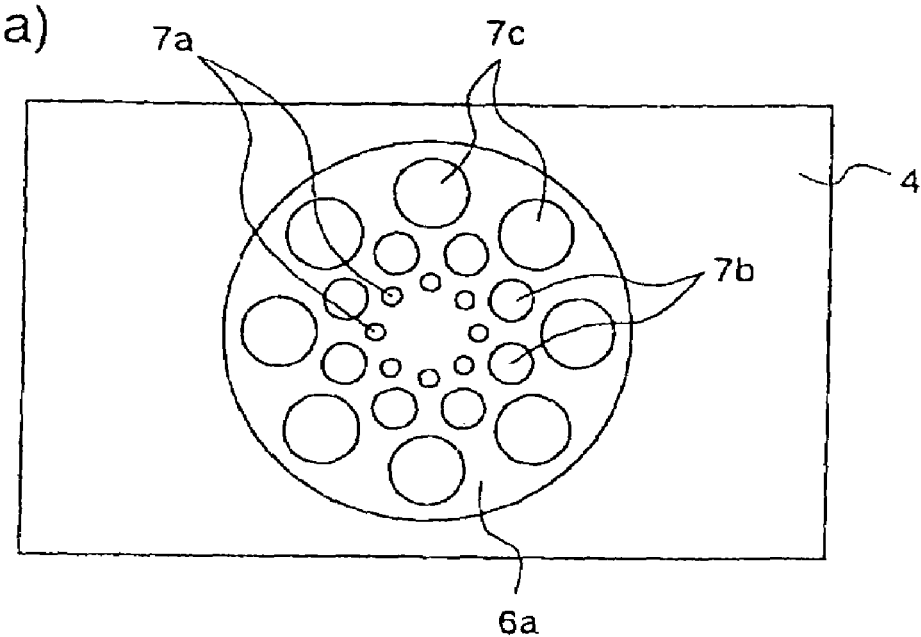
FIGS. 2(a) and 2(b) are diagrams illustrating additional examples of lower electrodes in the surface emitting laser of the first embodiment.

A lower electrode 6a shown in FIG. 2(a) is obtained by forming plural fine holes in a single electrode layer constituting the lower electrode. In the lower electrode 6a, the diameters of file holes 7a which are formed in the center portion of the electrode 6a are smaller than the diameters of fine holes 7c in the peripheral portion thereof. Further, the diameters of fine holes formed in an intermediate portion between the center portion and the peripheral portion of the lower electrode 6a are smaller than the diameters of the fine holes 7a in the center portion and larger than the diameters of the fine holes 7c in the peripheral portion.

In the lower electrode 6a having the plural fine holes as described above, the area density in a part where the lower electrode 6a contacts the DBR layer 4 is increased toward the center portion thereof, like the lower electrode 6 according to the first embodiment, whereby the density distribution of carriers injected into the active layer of the surface emitting laser can be adjusted in accordance with the light power distribution in the active layer.

Figure 2B:
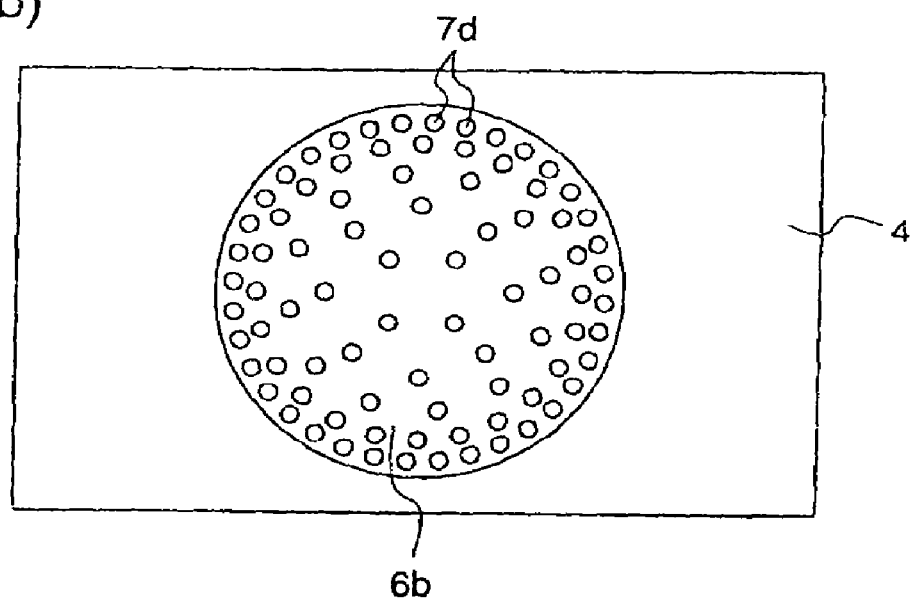

Further, a lower electrode 6b shown in FIG. 2(b) is obtained by forming a plurality of fine holes 7d in a single electrode layer constituting the electrode, like the lower electrode 6a shown in FIG. 2(a). In the lower electrode 6b, the layout density of the fine holes 7d is increased toward the peripheral portion thereof.

In the lower electrode 6b having the plural fine holes as described above, the area density in a part where the lower electrode 6b contacts the DBR layer 4 is increased toward the center portion thereof, like the lower electrode 6 of the first embodiment, whereby the density distribution of carriers injected into the active layer of the surface emitting laser can be adjusted in accordance with the light power distribution in the active layer.

The lower electrode 6a shown in FIG. 2(a) or the lower electrode 6b shown in FIG. 2(b) can be easily fabricated by subjecting a metal layer or the like constituting the lower electrode to selective etching using a mask.

Further, when the lower electrode having the plural fine holes is formed over the entire surface of a region where it can be disposed, heat radiation to the heat sink can be improved.

While in this first embodiment the density distribution of the current injected into the active layer is adjusted to make it match the light intensity distribution in the active layer by the plane shape of the lower electrode, the density distribution of the current injected into the active layer may be adjusted by partially disposing a current stopping layer between the lower electrode 600 and the DBR layer 4 in the conventional surface emitting laser.

FIG. 3 is a diagram for explaining a specific example of a current stopping layer.

Figure 3A:
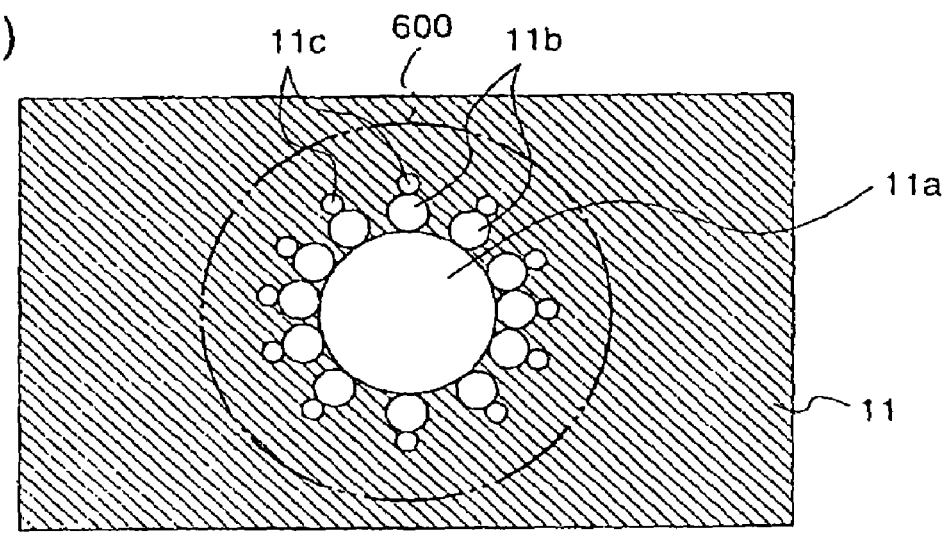
FIGS. 3(a) and 3(b) are diagrams illustrating additional examples of lower electrodes in the surface emitting laser of the first embodiment.

A current stopping layer shown in FIG. 3(a) comprises an insulating layer 11 which has plural holes and is disposed between the lower electrode 600 and the DBR layer 4.

In this insulating layer 11, a hole 11a having a large diameter is formed in a part corresponding to the center portion of the lower electrode 600, and plural holes 11b each having a medium diameter smaller than the diameter of the hole 11a are formed along the periphery of the hole 11a, and further, plural holes 11c each having a small diameter smaller than the medium diameter are formed outside the holes 11b.

The insulating film 11 having the plural holes as described above is disposed between the lower electrode 600 and the DBR layer 4, whereby the area density of the part where the lower electrode 600 contacts the DBR layer 4 is increased toward the center portion of the lower electrode 600, and therefore, the density distribution of carriers injected into the active layer of the surface emitting laser can be adjusted to a distribution in accordance with the light power distribution in the active layer.

Figure 3B:
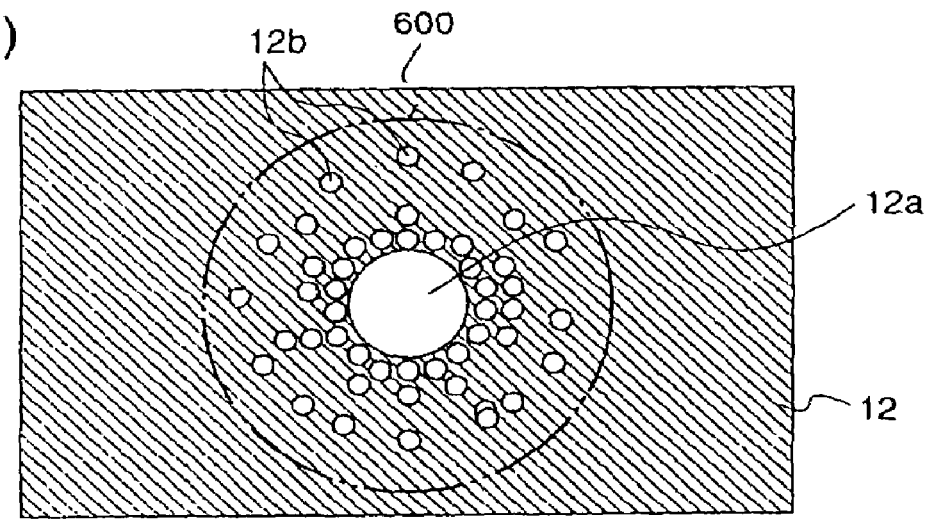

The current stopping layer shown in FIG. 3(b) comprises an insulating layer 12 which has plural holes and is formed between the lower electrode 600 and the DBR layer 4.

In the insulating layer 12, a large-diameter hole 12a is formed in a position corresponding to the center portion of the lower electrode, and a plurality of small-diameter holes 12b are formed outside the large-diameter hole 12a so that the density of the holes 12b is decreased with distance from the center of the lower electrode 600.

The insulating film 12 having the plural holes is disposed between the lower electrode 600 and the DBR layer 4, whereby the area density in a part where the lower electrode 600 contacts the DBR layer 4 is increased toward the center portion of the lower electrode 600 as in the first embodiment, and consequently, the density distribution of carriers injected into the active layer of the surface emitting laser can be adjusted to a distribution in accordance with the light power distribution in the active layer.

Further, when adopting the electrode structure in which the current stopping layer is disposed between the lower electrode and the DBR layer as shown in FIGS. 3(a) and 3(b), fabrication of the lower electrode is simplified, and the area of the lower electrode is increased, whereby the contact area of the lower electrode to the external heat sink via a solder is also increased. Accordingly, the electrode structure using the current stopping layer shown in FIG. 3(a) or 3(b) is superior in heat radiation and is advantageous to high power output.

Further, the electrode structure shown in FIG. 3(a) or 3(b) may have, instead of the current stopping layer, a resistive layer having an in-plane distribution of resistance values.

In this case, in the resistance distribution of the resistive layer in the electrode structure, the resistance value is decreased with distance from the center of the lower electrode. Thereby, the density distribution of carriers injected into the active layer of the surface emitting laser can be adjusted to a distribution according to the light power distribution in the active layer.

Furthermore, the electrode structure in which the lower electrode and the DBR layer are connected is not restricted to those having the current stopping layer and the resistive layer, but the lower electrode itself may have an in-plane distribution of resistance values. In this case, in the resistance distribution of the lower electrode, the resistance value is decreased with distance from the center of the lower electrode. Thereby, the density distribution of carriers injected into the active layer of the surface emitting laser can be adjusted to a distribution according to the light power distribution in the active layer.

Furthermore, while in the first embodiment the semiconductor substrate constituting the surface emitting laser comprises a semiconductor comprising a nitrogen compound containing GaN as a main component, the semiconductor substrate of the surface emitting laser may be a SiC substrate or the like, on which a III-V group nitride-base semiconductor material can be epitaxially grown.

Further, the surface emitting laser of the preset invention is not restricted to that comprising the above-mentioned III-V group nitride-base semiconductor material. For example, the material constituting the surface emitting laser may be an AlGaAs or AlGaInP system semiconductor material or a ZnSe system semiconductor material. Even when using such semiconductor material, a high-output surface emitting laser that oscillates laser with a stable fundamental transverse mode can be realized. Especially when an AlGaInP system semiconductor material is formed on a GaAs substrate whose plane orientation inclines from (100) to [0-11] or [011], band-gap fluctuation due to crystal ordering does not occur. Therefore, a surface emitting laser capable of stable high output operation can be realized by using an AlGaInP system semiconductor material.

Furthermore, in this first embodiment, a region of the semiconductor substrate 2a which is opposed to the lower electrode 6 is etched from the rear surface of the substrate 2a up to a position near the active layer 3 on the front surface of the substrate 2a to fabricate the concave part 9, and the ring-shaped upper electrode 5 is formed on the rear surface of the substrate so as to surround the concave part 9. However, the upper electrode 5 is not restricted to the ring-shaped electrode formed on the rear surface side of the semiconductor substrate 2a, but it may be a transparent electrode formed at the bottom of the concave part 9. Since the active layer comes close to the upper electrode when such transparent electrode is used, loss of injection current into the active layer can be effectively reduced.

Further, in this first embodiment, a region of the semiconductor substrate 2a which is opposed to the lower electrode 6 is etched from the rear surface of the substrate 2a up to a position near the active layer 3 on the front surface of the substrate 2a, thereby fabricating the concave part 9. However, when a material having a high conductivity and being transparent to laser light is adopted as a material of the semiconductor substrate of the surface emitting laser, it becomes unnecessary to fabricate the concave part 9.

Furthermore, in the surface emitting laser of the first embodiment, the resonator is constituted by the DBR layer 4 which is one of the plural semiconductor layers deposited on the semiconductor substrate 2a, and the external mirror 1 which is disposed separately from the semiconductor substrate 2a. However, the surface emitting laser may be an ordinary thin-film surface emitting laser in which a resonator is constituted by semiconductor layers deposited on a semiconductor substrate. Also in the thin-film surface emitting laser, as described for the first embodiment, the high output characteristic of the laser can be dramatically enhanced by shaping the plane surface of the lower electrode 6 such that injection of current from the lower electrode 6 to the active layer is carried out with a high current density in the center portion of the lower electrode and with a low current density in the peripheral portion thereof.

Furthermore, the surface emitting laser of the first embodiment is a single laser element having a single surface emitting part. However, the surface emitting laser as a single laser element may be a multi-beam type surface emitting laser having plural surface emitting parts. In this case, the density distribution of carriers injected into an active layer of each surface emitting part of the surface emitting laser is adjusted to a distribution according to the light power distribution in the active layer, whereby saturation of gain in each surface emitting part is reduced, thereby realizing a large output semiconductor laser performing surface-emission of laser light.

Embodiment 2

FIG. 4 is a diagram illustrating a surface emitting laser according to a second embodiment of the present invention, wherein FIG. 4(a) shows a cross-sectional structure thereof, FIG. 4(b) shows the shape of a lower electrode thereof, and FIG. 4(c) shows a light intensity distribution in an emission region of an active layer. In FIG. 4, the same reference numerals as those shown in FIG. 1 denote the same components in the surface emitting laser of the first embodiment.

The surface emitting laser 100b according to the second embodiment is provided with a lower electrode 60 that is divided into two parts, instead of the star-shaped lower electrode 6 of the surface emitting laser 100a according to the first embodiment. In the surface emitting laser 100b, the surface of a concave part 9 formed on the rear surface of the semiconductor substrate 2a is subjected to non-reflection coating to reduce loss of light in the resonator.

The lower electrode 60 comprises, as shown in FIG. 4(b), a circular inner electrode part 60a positioned in the center of the lower electrode 60, and a ring-shaped outer electrode part 60b surrounding the inner electrode part 60a.

A portion of the lower electrode 60 between the outer electrode part 60b and the inner electrode part 60a is a resistive separation part 61 having a high resistance value. Since the lower electrode 60 is divided into two parts, the density distribution of current injected into the active layer 3 can be adjusted according to the light intensity distribution in the active layer 3.

To be specific, as shown in FIG. 4(c), the light intensity distribution in the active layer 3 is approximately equal to the Gaussian distribution in which the light intensity Cd2 is highest in the center of the emission region, i.e., the center portion of the active layer 3 opposed to the lower electrode, and decreases with distance from the center portion. Accordingly, in the surface emitting laser 100b of the second embodiment, a laser driving voltage applied to the inner electrode part 60a is higher than a laser driving voltage applied to the outer electrode part 60*b* so that the density distribution of current injected into the active layer 3 corresponds to the light intensity distribution. Further, in the surface emitting laser 100*b*, a laser driving voltage in which a high-frequency component is superposed on a DC component is applied to the external electrode part 60*b* to reduce coherence of generated laser light.

Next, the function and effect will be described.

The fundamental laser oscillation of the surface emitting laser 100*b* according to the second embodiment is carried out in like manner as that described for the surface emitting laser 100*a* of the first embodiment.

In this second embodiment, since the laser driving voltage on which a high-frequency component is superposed is applied to the outer electrode part 60*b* of the lower electrode 60 divided into two parts, the carrier density varies in a portion of the active layer 3 opposed to the outer electrode part 60*b*. Therefore, the laser oscillation state of the whole resonator varies, whereby temporal coherence is reduced.

Next, the characteristic of the surface emitting laser of the second embodiment will be described in comparison with that of the conventional surface emitting laser. In the conventional surface emitting laser, since the lower electrode has the single-electrode structure as described above, the transverse mode undesirably becomes multimode or the mode is destabilized during high output operation, resulting in difficulty in realizing a stable transverse mode.

On the other hand, in the surface emitting laser 100*b* of the second embodiment, since the lower electrode 60 is divided into two parts as shown in FIG. 4(*b*), the density distribution of carriers injected into the active layer can be approximated to the light intensity distribution in the active layer, resulting in a surface emitting laser having excellent high output characteristic, in which stability of the transverse mode during high output operation is significantly enhanced.

Further, in this second embodiment, since the resonator of the surface emitting laser 100*a* is constituted by the DBR layer 4 disposed on the semiconductor substrate 2*a*, and the external mirror 1 arranged separately from the semiconductor substrate 2*a*, a sufficient resonator length can be secured as in the first embodiment. Thereby, stability of the transverse mode of the resonator is increased, and the light distribution in the active layer 3 near the lower electrode 60 can be increased.

Further, in the surface emitting laser in which the effective area of the active layer is broad and the resonator is constituted using the external mirror, matching between the light intensity distribution and the injection carrier distribution in the active layer 3 is particularly important. In this second embodiment, however, since the lower electrode 6 of the surface emitting laser is divided into two parts, mismatching between the carrier density distribution and the light intensity distribution in the external mirror type surface emitting laser is resolved, and the high output characteristic of the surface emitting laser is significantly improved.

Even in the surface emitting laser in which the lower electrode is divided into plural parts, if the effective area of the active layer is narrow, it is difficult to create the density distribution of the injected carriers due to the division of the lower electrode, and loss of the injected current becomes a problem in the part of the resistive separation layer between the divided electrode parts. In this second embodiment, however, since the area of the active layer becomes sufficiently large by using the external mirror 1, the loss of the injected current due to the resistive separation layer can be mostly ignored, and therefore, the structure of the lower electrode divided into two parts is effective.

Further, in this second embodiment, the characteristics are significantly improved by varying the properties of the currents injected into the respective electrode parts. Particularly, when the conventional surface emitting laser is used at a large output power of 100 mW or more, it is difficult to stably drive the laser, or modulate the laser light, or superpose a high-frequency component on the laser driving current. However, these problems are solved in the surface emitting laser of the second embodiment.

Next, a description will be given of a mechanism for preventing occurrence of noise due to return light in the surface emitting laser of the second embodiment.

The return light noise is a phenomenon that noise is significantly increased due to return of the light emitted from the semiconductor laser back to the active layer. In order to avoid this phenomenon, a method of reducing the coherence of light is usually adopted. For example, there is adopted a method of superposing an RF signal of several 100 MHz on the driving current. In the conventional high-output semiconductor laser, however, the increase in the driving current causes significant increase in required RF power. The increase in the RF power leads to increase in power consumption, and further, the cost of the whole system is significantly increased because countermeasures for heat release and radiation are needed.

The surface emitting laser 100*b* of the second embodiment solves the problem of the high-frequency superposition in the high-output laser.

To be specific, the high-frequency superposition is a method of temporally changing the light oscillation state by changing the state of the carrier density of the semiconductor laser, thereby to reduce temporal coherence. Accordingly, the magnitude of the rate of change to the density of carriers injected into the active layer is important.

In the conventional surface emitting laser of the signal-electrode structure, the injected current disperses over the entire electrode. Therefore, in order to largely change the injection carrier density, it is necessary to increase the ratio of current to be changed at a high frequency with respect to the injected current, and thereby the RF amplitude of the high-frequency component superposed on the laser driving current is increased.

On the other hand, in the surface emitting laser 100*b* of the second embodiment, the lower electrode 60 is divided into plural electrode parts, and an RF signal is superposed on only a certain electrode part. In the surface emitting laser 100*b* thus constituted, since the lower electrode is divided into plural parts, the injection current due to each electrode part is significantly reduced as compared with the injection current due to the whole lower electrode. That is, the RF amplitude obtained when an RF signal is superposed on a part of the plural electrode parts obtained by dividing the lower electrode can be reduced to a specified fraction of the RF amplitude obtained when an RF signal is superposed on a single lower electrode, whereby the power of the high-frequency superposition can be significantly reduced. Further, even when an RF signal is superposed on a certain electrode part, variation in the density of injected carriers due to this electrode part can be sufficiently obtained, whereby the oscillation state of the whole resonator changes to reduce temporal coherence.

Furthermore, in the surface emitting laser 100*b* of the second embodiment, as illustrated in the light intensity distribution shown in FIG. 4(*c*), it is necessary to supply a large current to the electrode part 60*a* positioned in the vicinity of the center of the emission region in order to obtain high output, while only a small current according to the light power density is required for the electrode part 60*b* in the periphery part distant from the center of the emission region. Therefore, when an RF signal is superposed on the laser driving current that is supplied to the electrode part positioned near the periphery of the emission region, coherence can be efficiently reduced with low RF power, thereby realizing miniaturization, cost reduction, and reduction in power consumption of the system.

The structure in which the lower electrode is divided into two parts according to the second embodiment is particularly effective to a GaN laser, and hereinafter, the reason therefor will be briefly described.

In a semiconductor laser including a GaN substrate as a base, relaxation oscillation is great and spike noise occurs when high frequency superposition is carried out. This is a phenomenon that the output light waveform varies spike-wise due to relaxation oscillation when the current injected into the semiconductor laser is modulated with an RF signal, and a pulse output that is many times higher than the modulation degree occurs. In an optical disc system using a GaN laser, in order to prevent noise in the laser from increasing due to return light during playback of the optical disc, an RF signal is superposed on a laser driving current. In the GaN laser, however, a spike-shaped output having a high peak value is outputted even when the average power during playback is low, and this spike-shaped output causes a problem of degradation in playback light, by which recorded data are degraded during playback.

On the other hand, in the structure where an electrode is divided into plural parts and an RF signal is superposed on only a specific electrode part, the peak value of the spike-shaped output can be significantly reduced to half or less, with the return light noise of the laser being reduced.

Accordingly, the surface emitting laser 100b of the second embodiment having the lower electrode divided into plural parts is preferably applied to an optical disc device or the like.

Further, even in lasers other than the GaN system laser, such as semiconductor lasers using an AlGaAs system semiconductor material or an AlGaInP system semiconductor material, it is possible to divide an electrode into plural parts, and efficiently superpose an RF signal on a laser driving current.

Further, the structure of the second embodiment in which the lower electrode divided into plural parts plays an effective role in modulating the output of the surface emitting laser.

Presently, when modulating an output of a semiconductor laser, a laser driving current is entirely modulated. However, when the entire driving current of the semiconductor laser is modulated, a chirping phenomenon occurs, in which the temperature of the semiconductor laser increases due to increase in power consumption and thereby oscillation wavelength varies. For example, when performing recording onto media such as an optical disc, recording is carried out while modulating light from a light source. At this time, if the wavelength of the light from the light source varies due to chirping, the size of a focus spot varies due to chromatic aberration. This phenomenon is particularly remarkable in a short wavelength region where the dispersion characteristic of the optical system is remarkable.

The surface emitting laser 100b according to the second embodiment is effective in reducing such chirping phenomenon. That is, the lower electrode is divided into two parts, and a current injected into one of the two electrodes is modulated, whereby variation in the injected current in the whole laser is reduced, and the chirping is minimized.

As described above, according to the second embodiment, the lower electrode 60 is divided into two parts, i.e., the inner electrode part 60a and the outer electrode part 60b, and a laser driving voltage on which an RF signal is superposed is applied to the outer electrode part that is farther from the center of the emission region than the inner electrode part, whereby the density distribution of carriers injected into the active layer of the surface emitting laser can be adjusted to a distribution according to the light intensity distribution in the active layer.

To be specific, as compared with the conventional surface emitting laser having the single-structure electrode, more carriers can be injected into the emission center portion even with the same injection current value, and further, it is possible to relax the phenomenon that the density of carriers injected into the active layer from the electrode part that is distant from the emission center becomes extremely high. As a result, slope efficiency is enhanced, resulting in a reduction in the injection carrier density and an increase in the saturation level of the optical output.

Furthermore, the effect of the increased light output due to the electrode structure which is divided into plural parts in the surface emitting laser of the second embodiment is particularly effective in a GaN system surface emitting laser having a high threshold carrier density and a high differentiation gain.

While in this second embodiment the lower electrode 60 is divided into two parts, the lower electrode may be divided into more parts. In this case, the divided plural electrode parts are arranged substantially evenly around the emission center of the laser light. Thereby, the carrier densities in the active layers having different light intensity distributions can be easily made uniform, and further, more stable single transverse mode operation can be achieved during high output.

Further, the surface emitting laser of the second embodiment is not restricted to that comprising the above-mentioned III-V group nitride system semiconductor material. For example, the material constituting the surface emitting laser of the second embodiment may be an AlGaAs or AlGaInP system semiconductor material or a ZnSe system semiconductor material. Also when these semiconductor materials are used, a high-power semiconductor laser that oscillates laser with a stable fundamental transverse mode can be realized by adopting the structure in which the lower electrode is divided into plural parts.

Further, while in the first or second embodiment a single surface emitting laser fabricated on a semiconductor substrate is described, a plurality of surface emitting lasers 100a according to the first embodiment or a plurality of surface emitting lasers 100b according to the second embodiment may be fabricated on a single semiconductor substrate.

Figure 5A:
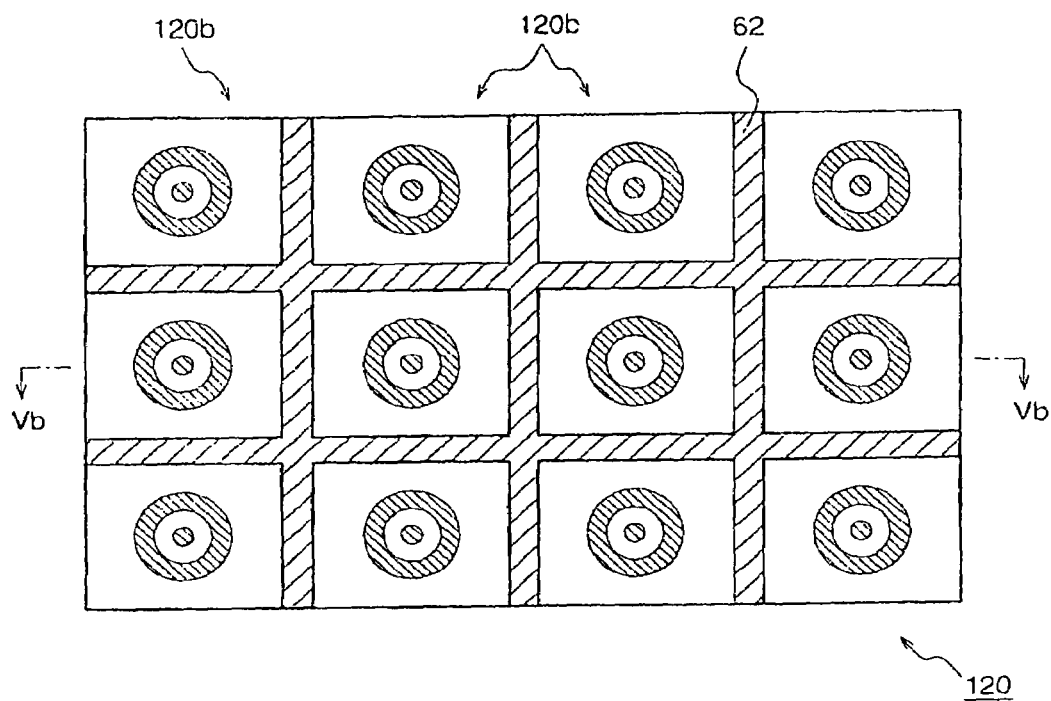
FIGS. 5(a) and 5(b) are a plan view (5(a)) and a cross-sectional view (5(b)) illustrating an application of the surface emitting laser of the second embodiment.
Figure 5B:
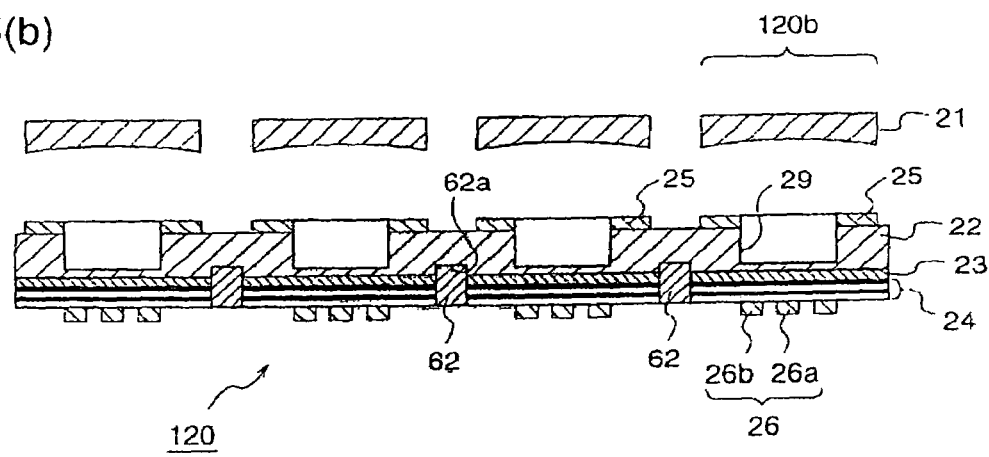

FIG. 5 is a diagram illustrating a specific example of a semiconductor laser device in which plural surface emitting lasers are fabricated on a single semiconductor substrate, wherein FIG. 5(a) shows the shape of a lower electrode thereof, and FIG. 5(b) shows a cross-sectional view taken along Vb-Vb in FIG. 5(a).

The semiconductor laser device 120 is obtained by, as shown in FIG. 5(a), fabricating plural surface emitting lasers 120b identical to the surface emitting laser of the second embodiment on a single semiconductor substrate 22.

More specifically, as shown in FIG. 5(b), an active layer 23 and a DBR layer 24 are deposited on the surface of the semiconductor substrate 22. On a surface side of the semiconductor substrate 22, a separation groove 62a is formed from the surface of the DBR layer 24 to reach into the substrate 22, and an insulating material is embedded in the separation groove to provide a resistive separation region 62. A plurality of the separation grooves 62a are formed in the vertical direction and the horizontal direction, and lower electrodes 26 each divided into two parts, which are similar to the lower electrode of the second embodiment, are disposed in regions surrounded by the separation grooves 62a.

Further, on the other surface side of the semiconductor substrate 22, ring-shaped upper electrodes 25 are fabricated opposed to the respective lower electrodes 26, and concave parts 29 are formed by etching portions of the substrate 22 inside the respective upper electrodes 25. Further, external mirrors 21 are disposed above the respective upper electrodes 25.

As described above, the plural surface emitting lasers 120b are formed in the single substrate, and the adjacent surface emitting lasers 120b are separated by the resistive separation regions 62, whereby increase in output power is achieved, and interaction between the adjacent surface emitting lasers 120b is prevented by the resistive separation regions 62.

Embodiment 3

Figure 6:
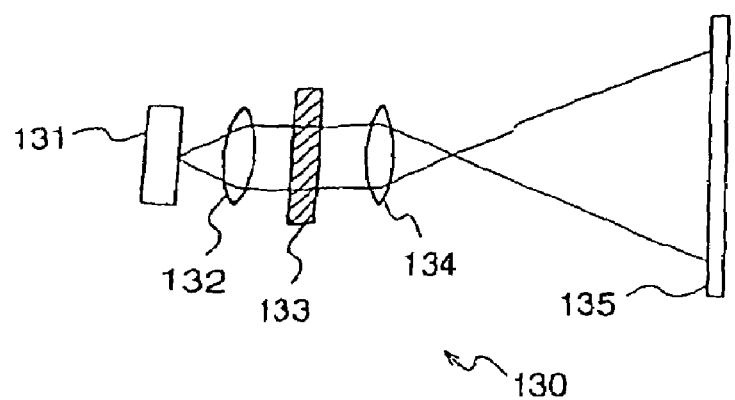
FIG. 6 is a diagram illustrating a laser projector according to a third embodiment of the present invention.

FIG. 6 is a schematic diagram for explaining a laser projector according to a third embodiment of the present invention.

The laser projector 130 according to the third embodiment includes a laser light source 131, a lens 132 for collimating laser light emitted from the laser light source 131, a spatial modulator 133 for spatially modulating the collimated laser light, and a projection lens 134 for projecting the modulated laser light on a screen 135. In the laser projector 130 of this third embodiment, a surface emitting laser identical to the surface emitting laser 100b of the second embodiment having the lower electrode divided into plural parts is adopted as a laser light source. Further, in the surface emitting laser as a laser light source according to the third embodiment, a current injected into the active layer from a certain electrode part among the plural electrode parts into which the lower electrode is divided is modulated, and further, an RF signal is superposed on the current injected into the certain electrode part. Particularly in the surface emitting laser of this third embodiment, RF signals of different frequencies are superposed on the inner electrode part and the outer electrode part.

Next, the function and effect will be described.

Hereinafter, initially a description will be given of the construction of a semiconductor laser applied to a laser display which is a kind of a laser projector as mentioned above.

The laser display is a display device using RGB laser light, and a large output ranging from several 100 mW to several W is needed as a laser output.

So, a consideration will be given of a case where the surface emitting laser according to the first or second embodiment is applied to the laser display as a kind of a laser projector of the third embodiment.

The surface emitting laser of the first or second embodiment has the following characteristics.

The first characteristic is that high power output is easily achieved, and stable single transverse mode oscillation can be carried out.

The second characteristic is that the beam shape is close to an ideal circle, and therefore, a focus beam for laser display can be realized with a simple optical system, without requiring an optical system for shaping. Especially the surface emitting laser 100b of the second embodiment can execute high-output light modulation.

Although it is very effective to apply the surface emitting laser having the above-mentioned output characteristics to a laser display, the following characteristics are required in addition to the above-mentioned output characteristics in order to use the surface emitting laser as a light source for a laser display.

Initially, wavelength stability is required. Especially in a red laser, since visibility largely varies with wavelength, variation in wavelength must be suppressed within a range of ±1 nm or less.

Further, in order to reduce speckle noise, reduction in coherence is important, and the wavelength spectrum width must be expanded to several nm.

In this third embodiment, the above-mentioned two problems, i.e., suppression of wavelength change and expansion of wavelength spectrum width have already been solved, and these points will be described hereinafter in comparison with the conventional one.

Initially, wavelength stability will be described.

When an image is projected by laser light, it is necessary to modulate the laser output intensity in accordance with gradient. At this time, mode stability and wavelength change as well as output intensity become problems. That is, in the laser display, laser light must be modulated to a value ranging from 100 nW to several mW, and at this time, the laser wavelength varies with the output intensity. Accordingly, in the conventional high output semiconductor laser, the driving current during high output operation significantly differs from the driving current during low output operation, thereby occurring chirping by which the oscillation wavelength varies significantly due to variations in temperature of the laser.

On the other hand, in the surface emitting laser as a laser light source of the laser projector 130 of the third embodiment, as shown in FIG. 4, the lower electrode is divided into plural electrode parts, and a current injected into the active layer from a certain electrode part is modulated, whereby variations in the injected current can be reduced, and stable modulation having less wavelength variation can be carried out. Further, in the surface emitting laser, the gradient can be increased by stabilizing the transverse mode.

Next, a description will be given of expansion of the wavelength spectrum width to reduce speckle noise.

Since the laser display light source needs high output characteristic, it is necessary to perform RF superposition in the state where the average output is kept at 100 mW or higher.

Accordingly, in the conventional semiconductor laser, RF superposition should be carried out under the state where a current of several 100 mA is injected, and therefore, a high-power RF circuit for applying an RF signal having a current amplitude of several 100 mA is needed. In this case, however, extremely large power consumption is needed, and reduction in power consumption and reduction in external radiation become problems.

On the other hand, in the surface emitting laser as a laser light source according to the third embodiment, since an RF signal is superposed on a current injected into a certain electrode part among the divided plural electrode parts, the RF current can be reduced, and the current density can be reduced in a portion of the active layer distant from the center of the emission region, whereby the injection current can be reduced. As a result, it is possible to significantly reduce the amplitude of the superposed RF signal, which depends on the injection current, thereby realizing simplification, miniaturization, and reduction in power consumption of the system.

Next, a description will be given of prevention of speckle noise by further reduction in coherence.

Since reduction in coherence is proportional to expansion of spectrum width, speckle noise can be further reduced when the spectrum width is increased. In order to realize this, it is effective to increase the power of the RF current that is superposed on the driving current of the semiconductor laser.

So, in the surface emitting laser as a laser light source according to the third embodiment, RF signals of different frequencies are applied to the inner electrode part and the outer electrode part, respectively, so as to further expand the spectrum width.

For example, when an RF signal of 500 MHz is applied to one of the inner electrode part and the outer electrode part while an RF signal of 400 MHz is applied to the other electrode part, relative disturbance of the oscillation state due to the injection currents from the respective electrode parts is increased, whereby expansion of the spectrum width is increased. At this time, although the increase in the spectrum width has frequency dependency, the amount of increase in the spectrum width can be 1.2~1.5 times of that in the case where an RF signal is applied to a single electrode.

The electrode division structure of the surface emitting laser according to the second embodiment which is used for the laser projector 130 of the third embodiment is especially effective in reducing coherence of high output light of 100 mW or more.

Further, in the surface emitting laser used in the laser projector according to the third embodiment, the oscillation wavelength may be varied by self-excitation oscillation utilizing supersaturation absorption to reduce speckle noise. The self-excitation oscillation is an oscillation state where the semiconductor laser emits laser light pulsewise although a DC current is applied to the semiconductor laser.

To be specific, it has been difficult to apply the self-excitation oscillation to a high-output semiconductor laser because the self-excitation oscillation utilizes supersaturation absorption. However, since the surface emitting laser used in the laser projector of the third embodiment is constituted such that the lower electrode is divided into two parts, i.e., the inner electrode part and the outer electrode part, when a supersaturation absorber is provided in a portion of the active layer corresponding to the periphery of the lower electrode, in which the injection current density is reduced, it is possible to reduce speckle noise by the self-excitation oscillation utilizing supersaturation absorption in the high-output surface emitting laser.

As described above, according to the third embodiment, since the surface emitting laser having a structure in which the lower electrode is divided into the inner electrode part and the outer electrode part as described for the second embodiment is adopted as a laser light source of the laser projector, the density of the current injected into the active layer can be matched to the light intensity distribution in the active layer, and moreover, the current density can be reduced in a portion of the active layer, which is distant from the center of the emission region, thereby reducing the injection current.

Furthermore, in the third embodiment, since an RF signal is superposed on the current injected into the active layer from a part of the divided plural electrodes, the RF current can be reduced.

As a result, simplification, miniaturization, and reduction in power consumption of the laser projector can be achieved.

Embodiment 4

Figure 7:
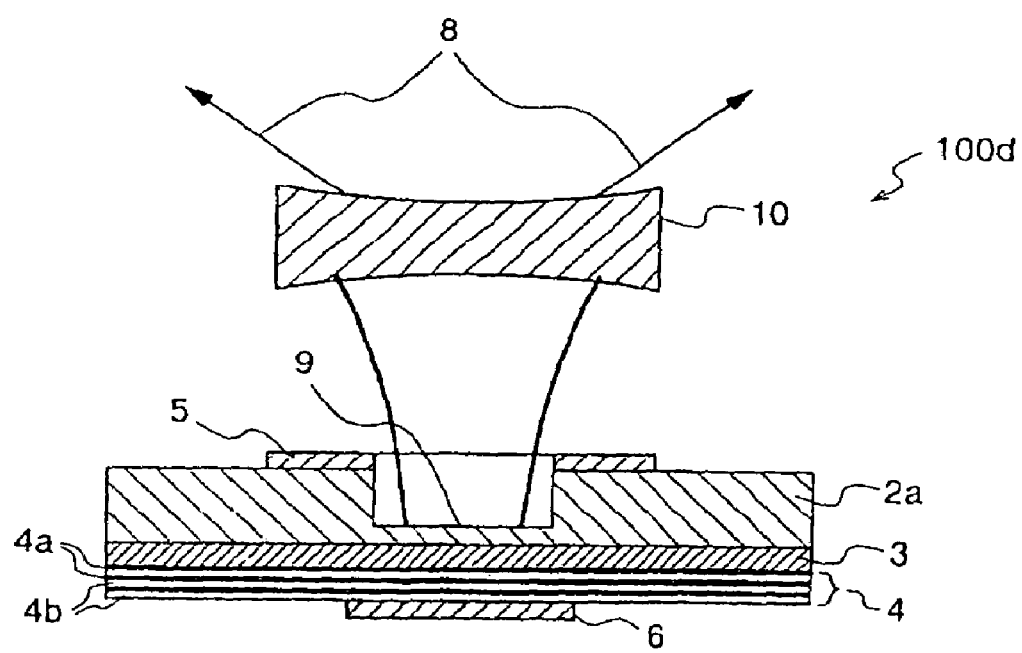
FIG. 7 is a diagram illustrating a surface emitting laser according to a fourth embodiment of the present invention.

FIG. 7 is a diagram illustrating a surface emitting laser according to a fourth embodiment of the present invention, illustrating a cross-sectional structure of the surface emitting laser. In FIG. 7, the same reference numerals as those shown in FIG. 1 denote the same elements as those of the surface emitting laser of the first embodiment.

The surface emitting laser 100d according to the fourth embodiment is provided with an external mirror 10 having both surfaces shaped in concave, instead of the external mirror 1 in the surface emitting laser 100a of the first embodiment.

Next, the function and effect will be described.

A surface emitting laser has a small spread angle of emitted light, and therefore, it is easily combined with an optical system such as a fiber. However, the characteristic of the surface emitting laser that the spread angle of emitted light is small is not preferable to miniaturization of a bulk optical system using an external lens or the like. The reason is as follows. When the light emitted from the surface emitting laser is collimated or condensed by a lens system, the distance required for expanding the light to an effective diameter of the lens is undesirably increased.

On the other hand, in the surface emitting laser 100d of the fourth embodiment, as shown in FIG. 7, the spread angle of the emitted light 8 is increased by shaping the both surfaces of the external mirror 10 into concave. Accordingly, in the surface emitting laser 100d of this fourth embodiment, the distance required for expanding the emitted light to the effective diameter of the lens is short, and therefore, it is effective to miniaturization of a bulk optical system.

Embodiment 5

Figure 8A:
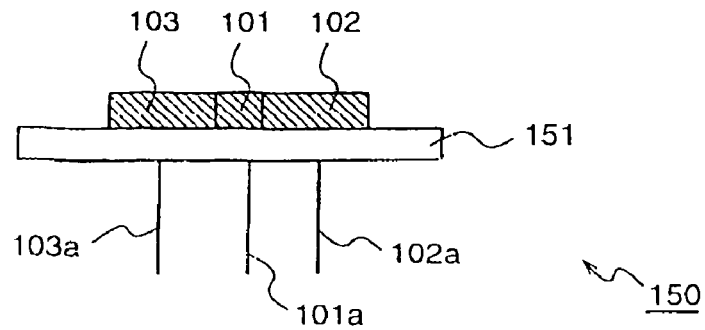
FIGS. 8(a) and 8(b) are a side view (8(a)) and a plan view (8(b)) illustrating an example of a laser module according to a fifth embodiment of the present invention.
Figure 8B:
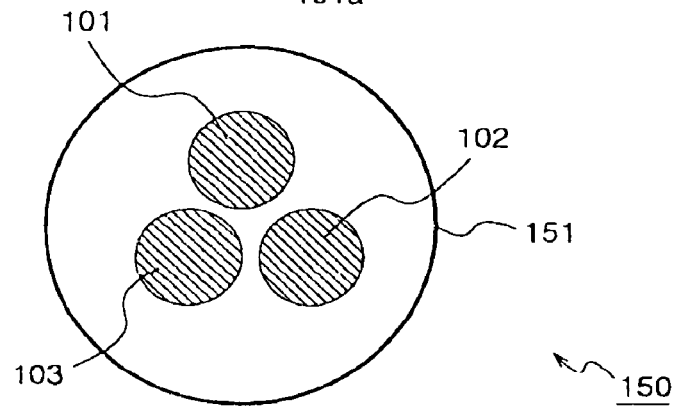

FIG. 8 is a diagram illustrating an example of a laser module according to a fifth embodiment of the present invention, wherein FIG. 8(a) is a side-elevation view, and FIG. 8(b) is a plan view.

The laser module 150 according to the fifth embodiment is useful as a compact RGB light source to be applied to a laser display.

The laser module 150 is obtained by mounting surface emitting lasers in a package, and three surface emitting lasers 101~103 are attached onto a base member 151 of the package. The rear surface of the base member 151 serves as a heat radiation surface, and lead terminals 101a, 102a, and 103a of the surface emitting lasers 101, 102, and 103 are pulled out from the rear surface of the base material 151.

The respective surface emitting lasers 101~103 have the same construction as any of the surface emitting lasers described for the first to fourth embodiments, and the surface emitting laser 101 is a red surface emitting laser, the surface emitting laser 102 is a green surface emitting laser, and the surface emitting laser 103 is a blue surface emitting laser. These three surface emitting lasers on the base member 151 are arranged at equal intervals on a circumference whose center matches the center of the package.

Next, the function and effect will be described.

In order to realize a compact laser display, miniaturization of a light source is indispensable. For this purpose, it is effective to use, as a light source, the surface emitting laser described for any of the first to fourth embodiments.

Since the surface emitting laser described for any of the first to fourth embodiments has the external mirror, it can achieve an increase in output power. Further, since the surface emitting laser includes the active layer in a position near the lower electrode, it is superior in heat radiation and is advantageous in generating high-power output. Further, since the surface emitting laser has a low power density of light at a facet on the substrate side, no facet deterioration occurs, resulting in excellent reliability. Especially, the surface emitting laser of the second embodiment has superiority in dramatically enhancing the high output characteristic by the electrode division structure.

Further, the surface emitting laser is effective in realizing a moduled multi-wavelength integrated light source. To be specific, the surface emitting laser can perform rear radiation, that is, it can release heat from the surface opposite to the laser light emitting surface. Therefore, as shown in FIG. 8, when different surface emitting lasers are mounted in a single package, the package structure is significantly simplified, leading to cost reduction. Further, in the multi-wavelength integrated light source as a laser module, heat radiation can be carried out from the rear surface of the package, and the laser output can be taken out from the front surface of the package.

As described above, according to the fifth embodiment, the laser module is constructed by mounting, in a package, three surface emitting lasers 101, 102, and 103 corresponding to red, green, and blue, which have the same structure as the surface emitting laser described for any of the embodiments of the invention. Therefore, a compact integrated light source can be obtained, resulting in an ultracompact laser irradiation device.

While in this fifth embodiment a multi-wavelength light source that outputs three wavelengths of laser lights is described as a laser module obtained by mounting surface emitting lasers in a package, the multi-wavelength light source may have two wavelengths or four or more wavelengths.

Further, the number of surface emitting lasers constituting the laser module and the arrangement of the surface emitting lasers in the package are not restricted to those of the fifth embodiment.

Figure 9A:
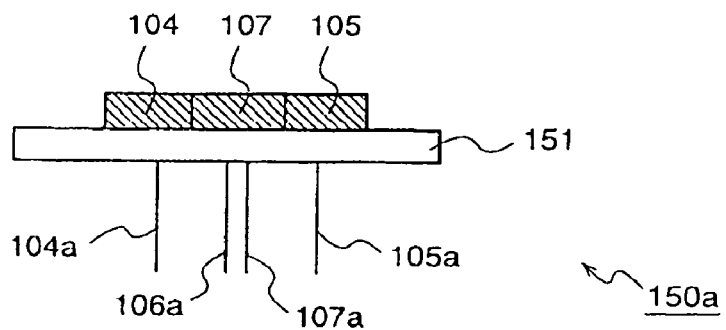
FIGS. 9(a) and 9(b) are a side view (9(a)) and a plan view (9(b)) illustrating a modification of the surface emitting laser according to the fifth embodiment.
Figure 9B:
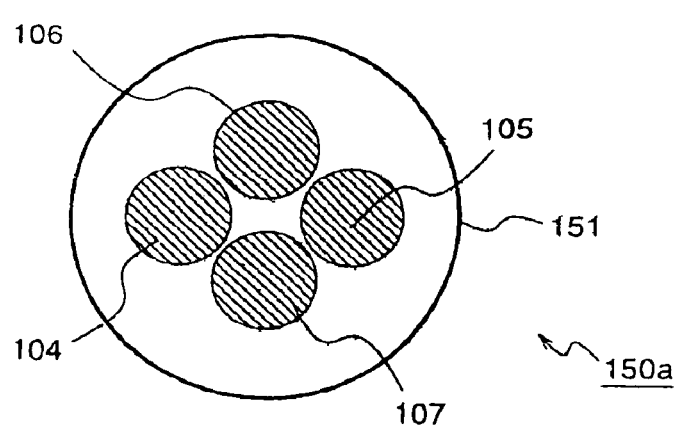

FIG. 9 is a diagram illustrating the laser module according to the fifth embodiment in which the number of surface emitting lasers and the arrangement thereof are changed, wherein FIG. 9(a) is a side elevation view, and FIG. 9(b) is a plan view.

The laser module 150a shown in FIG. 9 implements an RGB 3-wavelength laser light source, which is similar to the laser module 150 shown in FIG. 8.

The laser module 150a is obtained by mounting four surface emitting lasers in a package, and two green surface emitting lasers 106 and 107 are arranged close to each other so as to be positioned on an axis line passing the center of the package, in the center portion of the base member 151 of the package. Further, a red surface emitting laser 104 and a blue surface emitting laser 105 are arranged on another axis line that passes the center of the package and is perpendicular to the above-mentioned axis line so as to sandwich the two green surface emitting lasers. The respective surface emitting lasers are identical in structure to any of the surface emitting lasers according to the first to fourth embodiments, and the arrangement of the four surface emitting lasers on the base member is symmetrical with respect to the center of the package.

The rear surface of the base member 151 is a heat radiation surface, and lead terminals 104a, 105a, 106a, and 107a of the surface emitting lasers 104, 105, 106, and 107 are pulled out at the rear surface of the base member 151.

In the laser module as an RGB light source that emits laser beams of three wavelengths corresponding to red, green, and blue, arrangement of the surface emitting lasers of the respective colors is important. That is, when an RGB light source is realized by surface emitting lasers, it is particularly difficult to increase the output power of the green light source. Although the green light source is usually realized by a ZnSe laser material, the lifetime thereof is reduced during high output operation. Therefore, the green light source must be used at relatively low output power.

In the laser module shown in FIG. 9(b), two green surface emitting lasers 104 and 105 are adopted, and these green lasers are arranged close to each other, and further, the red surface emitting laser 106 and the blue surface emitting laser 107 are disposed on the both sides of the green surface emitting lasers. Thereby, high-output power and long lifetime of the laser light source is realized.

Furthermore, the laser module 150 of the fifth embodiment shown in FIG. 8 and the laser module 150a obtained by changing the number and arrangement of the surface emitting lasers in the laser module 150, which modules are RGB light sources, may be combined with a liquid crystal panel, or a two-dimensional spatial modulator such as DMD (Digital Micromirror Device) used for DLP (Digital Light Processing), whereby it is possible to realize a laser projector which modulates the light emitted from the RGB light source by the two-dimensional spatial modulator and projects the image, and the laser projector can be applied to a laser display.

Embodiment 6

Figure 10:
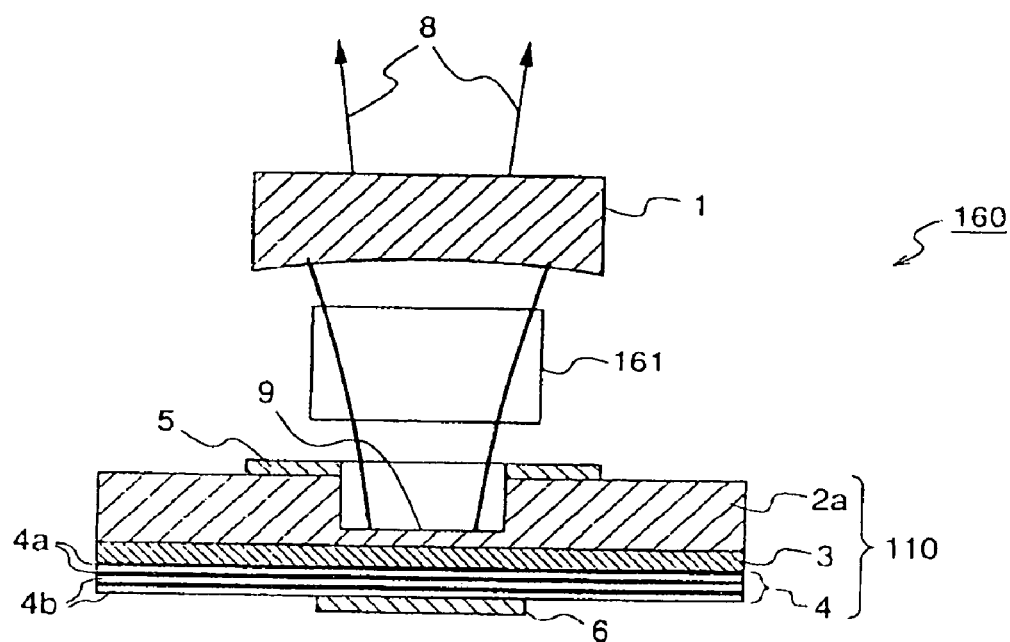
FIG. 10 is a diagram illustrating a semiconductor laser device according to a sixth embodiment of the present invention.

FIG. 10 is a diagram illustrating a semiconductor laser device according to a sixth embodiment of the present invention.

The semiconductor laser device 160 comprises a surface emitting laser for surface emitting laser light, and a wavelength converter 161 for converting the wavelength of the laser light from the surface emitting laser, which is disposed in a resonator of the surface emitting laser.

The surface emitting laser is identical in construction to the surface emitting laser 100a of the first embodiment. However, the surface emitting laser in the semiconductor laser device is not restricted to that of the first embodiment. The surface emitting laser may be that described for any of the second to fourth embodiments.

Further, the wavelength converter 161 comprises a non-linear optical crystalline member disposed between the external mirror 1 constituting the resonator and the active layer 3 formed on the semiconductor substrate 2a.

Preferably, the non-linear optical crystalline material may be $KTiOPO_4$ or polarization reversal $MgOLiNbO_3$. Particularly, since the polarization reversal $MgOLiNbO_3$ has a large non-linear constant, it can reduce the element length of the wavelength converter, and therefore, is suited to be inserted in a resonator that is separated from the external mirror by a relatively short distance.

Next, the function and effect will be described.

The semiconductor laser device 160 of this sixth embodiment can output short-wavelength laser light by converting the wavelength of the laser light generated by the surface emitting laser using the wavelength converter 161.

Hereinafter, characteristics of the semiconductor laser device 160 will be briefly described.

Since the tolerance of convertible wavelength of the wavelength converter is generally narrow, the wavelength of the fundamental wave for laser oscillation and the stability of the transverse mode considerably affect the wavelength conversion efficiency. Further, in the ordinary surface emitting laser, if the single mode property of the transverse mode is deteriorated or changed, the conversion efficiency is significantly reduced or varied.

On the other hand, the semiconductor laser device according to the sixth embodiment realizes excellent stability and high efficiency.

To be specific, since the non-linear optical crystalline member constituting the wavelength converter is disposed in the resonator, the power density of light incident on the non-linear optical crystalline member is increased, thereby realizing high-efficiency conversion by the wavelength converter.

While in this sixth embodiment a semiconductor laser device in which a wavelength converter is disposed in a resonator of a surface emitting laser is described as a semiconductor laser device obtained by combining a surface emitting laser and a wavelength converter, the wavelength converter may be disposed outside the resonator.

Figure 11:
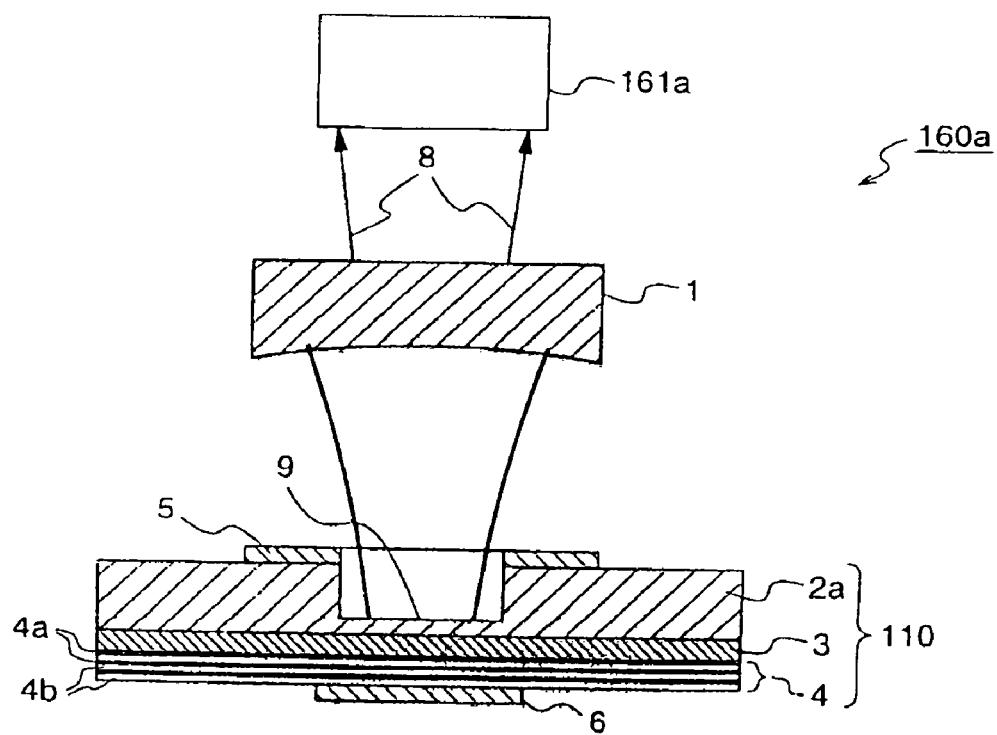
FIG. 11 is a diagram illustrating a modification of the semiconductor laser device according to the sixth embodiment.

FIG. 11 is a diagram illustrating another semiconductor laser device according to the sixth embodiment in which arrangement of the wavelength converter is changed.

In the semiconductor laser device 160a shown in FIG. 11, the wavelength converter 161a is disposed outside the resonator, and other constituents are identical to those of the semiconductor laser 160.

The wavelength converters in the semiconductor laser devices shown in FIGS. 10 and 11 may be waveguide type elements or bulk type elements.

However, since the conversion efficiency of the wavelength converter greatly depends on the focusing property of the fundamental wave, it is important to keep the transverse mode in a single mode. Accordingly, as described in the sixth embodiment, the semiconductor laser device for converting the wavelength of the output light from the surface emitting laser to output short-wavelength light must be able to control the transverse mode to a single mode, and execute high-output wavelength conversion.

Embodiment 7

Figure 12:
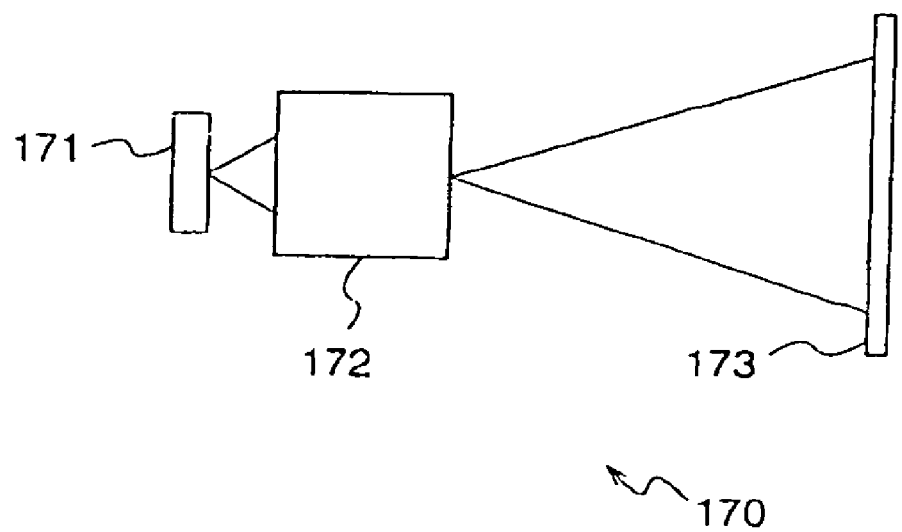
FIG. 12 is a diagram illustrating a relationship between wavelength and output required for a laser projector according to a seventh embodiment of the present invention.

FIG. 12 is a schematic diagram illustrating a laser projector according to a seventh embodiment of the present invention.

The laser projector 170 according to the seventh embodiment includes a laser light source 171, and a projection optical system 172 for projecting laser light emitted from the laser light source 171 on a screen 173. The laser projector 170 of this seventh embodiment adopts, as a laser light source, a surface emitting laser that is identical in construction to the surface emitting laser 100b of the second embodiment. However, the surface emitting laser used as a laser light source of the laser projector 170 is not restricted to that of the second embodiment, and the surface emitting lasers described for the other embodiments may be adopted.

Hereinafter, a description will be given of a laser display as a kind of the laser projector.

A laser display comprises an RGB light source and a projection optical system, and projects light from the laser light source to a screen or the like by the projection optical system to display a full-color image. Projection methods are classified into either a type of projecting laser light onto a target such as an external screen or wall to see the reflected light or a type of projecting laser light from the rear surface of a screen to see the reflected light. In either case, the color is recognized by the light scattered at a screen or the like.

However, when a semiconductor laser of a high coherence is used in the conventional laser display, there occurs a problem that light beams scattered on the screen interfere each other to cause speckle noise. As an effective method for reducing the speckle noise, there is a method of reducing coherence of the laser light. In order to reduce the coherence of the laser light, it is effective to set the transverse mode in a multimode. Especially, the speckle noise is significantly reduced by expanding the spectrum width of the transverse mode.

In the surface emitting laser used as a laser light source of the laser projector according to the seventh embodiment, as described for the second embodiment, since an RF signal is superposed on part of the plural electrode parts divided, the spectrum width is expanded to reduce the coherence. In order to reduce the speckle noise, the transverse mode spectrum width should be expanded to 1 nm or more in wavelength, and more preferably, to about 5 nm or more.

Further expansion of the transverse mode spectrum width is realized by utilizing the method of applying RF signals of different frequencies to different electrode parts.

The oscillation wavelength of the RGB light source is important, in view of the relationship between the wavelength used for the laser display and the visibility. A wavelength to be used and a required light intensity are determined according to the visibility. Further, a wavelength and a range of color reproducibility are determined according to the chromaticity.

Figure 13:
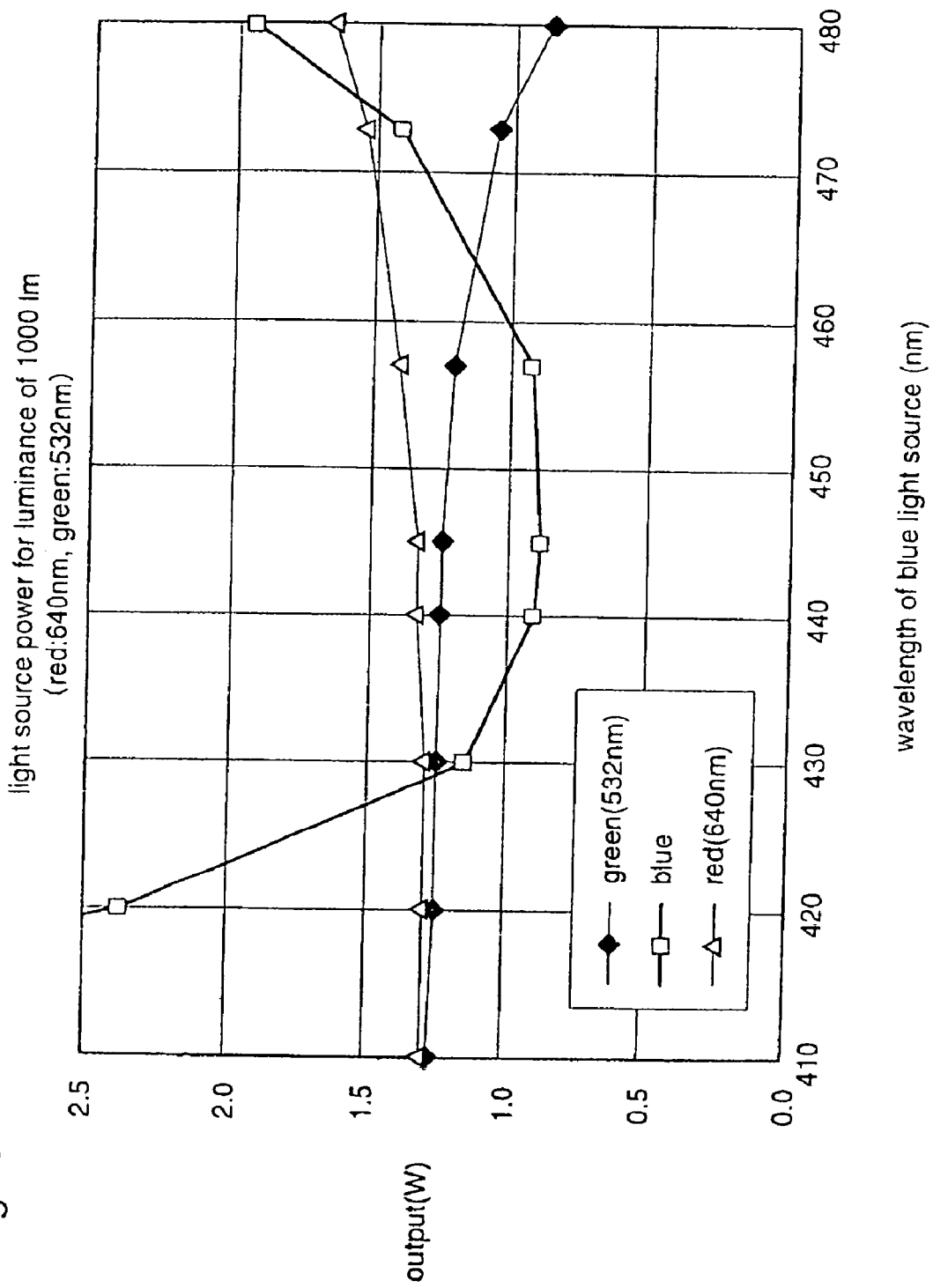
FIG. 13 is a diagram illustrating an output wavelength of the laser projector according to the seventh embodiment, illustrating the relationship between blue light source wavelength and required output.

FIG. 13 shows the relationship between the wavelength of a blue light source and required output. To be specific, FIG. 13 shows the relationship between the wavelength of blue and required output, for realizing brightness of 1000 lm on the screen when the wavelength of red is fixed to 640 nm and the wavelength of green is fixed to 532 nm.

Since the visibility of the blue light deteriorates when the wavelength thereof becomes 430 nm or less, the required power increases steeply. When the wavelength of the blue light becomes 460 nm or more, since it approaches the region of green, the expressible color range is narrowed and simultaneously the power required for expressing blue increases. At the same time, the power required for expressing red also increases.

On the other hand, as for a blue surface emitting laser comprising GaN semiconductor, a high output laser is realized usually at a wavelength near 410 nm. Although the dose of In must be increased to shift this wavelength to the longer-wavelength side, such increase in dose of In causes segregation of In and thereby degrades crystal composition, leading to reductions in reliability and high output characteristic. Accordingly, it is desired to set the wavelength of the blue laser adopting GaN to 455 nm or less. From the viewpoint of color reproducibility, it is preferable to use the blue light source of a relatively short wavelength because the range of colors expressible in the blue region is extended.

From the above-mentioned viewpoints, the wavelength region of the blue surface emitting laser is preferably 430 nm~455 nm. More preferably, the wavelength region should be 440 nm~450 nm. In this case, reduced power consumption and high color reproducibility are achieved by reduction in required power.

A red surface emitting laser can be implemented by an AlGaAs system semiconductor material or an AlGaInP system semiconductor material. However, in order to realize high power output, the wavelength region should preferably be 630 nm~650 nm. The wavelength region should more preferably be in a range of 640 nm±5 nm, in view of the visibility as well as expansion of the usage wavelength range of the blue light.

A green surface emitting laser can be realized by a ZnSe system semiconductor material.

That is, since the light power density in the waveguide is high in a Fabry-Perot semiconductor laser, it is difficult to obtain reliability when using a ZnSe system semiconductor material. However, when the green laser is constituted like the surface emitting laser of the present invention, reduction in the light power density in the crystal can be achieved, thereby securing high reliability. A wavelength region of 510 nm~550 nm is required as a wavelength region considering the color balance of the red surface emitting laser. However, when reliability of the surface emitting laser is considered, the wavelength region is desired to be 510 nm~520 nm, and high reliability and high output characteristic can be realized in this region. Further, the green surface emitting laser can also be realized using a semiconductor material obtained by doping a great amount of In into GaN. Also in this case, a desirable wavelength region is 500 nm~520 nm.

APPLICABILITY IN INDUSTRY

As described above, a surface emitting laser of the present invention suppresses hole burning that is caused by light power density distribution in an emission region to reduce deterioration in high-output characteristics, such as unstable transverse mode or gain reduction, and it is useful as a light source for an optical recording device or an optical display device which needs a high-output semiconductor laser, and furthermore, it is also applicable to laser processing, medical care and the like.

The invention claimed is:

1. A surface emitting laser for performing surface emission of laser light, comprising:
    a semiconductor layer laminated body including an active layer, a semiconductor substrate and a plurality of semiconductor layers laminated on the semiconductor substrate; and
    a pair of electrodes for injecting carriers into the active layer;
    wherein one of said electrodes comprises a single electrode layer in contact with said semiconductor layer laminated body defining a contact area, the contact area having a center portion and a peripheral portion at least partially surrounding the center portion, the peripheral portion having an outer periphery and an area density that continuously decreases from the center portion to the outer periphery, such that said one electrode is configured to inject current into the active layer, such that the current densities for the center portion and the peripheral portion are different.

2. A surface emitting laser as defined in claim 1 wherein plural fine holes are formed in the electrode layer, such that the occupation density of the fine holes differs between the center portion and the peripheral portion.

3. A surface emitting laser as defined in claim 1 wherein resistance values of the electrode layer differ between the center portion and the peripheral portion.

4. A surface emitting laser as defined in claim 1 further including:
    a resonator for amplifying light generated in the active layer to generate laser oscillation, said resonator comprising a reflection layer included in the semiconductor layer laminated body, and an external mirror disposed separately from the semiconductor layer laminated body so as to be opposed to the reflection layer.

5. A surface emitting laser as defined in claim 4 wherein said external mirror is a partial transmission mirror, both surfaces of which are concave in shape.

6. A surface emitting laser as defined in claim 4 further including:
    a non-linear optical member for converting the wavelength of laser light, said optical member being disposed between the external mirror and the active layer.

7. A surface emitting laser as defined in claim 1 wherein:
    said semiconductor layer laminated body includes an over-saturation absorber for absorbing over-saturated carriers in the active layer, said absorber being disposed in the vicinity of the active layer.

8. A surface emitting laser as defined in claim 1 wherein the oscillation wavelength of the surface-emitted laser light is within a range of 430~455 nm.

9. A surface emitting laser as defined in claim 1 wherein the oscillation wavelength of the surface-emitted laser light is within a range of 630~650 nm.

10. A surface emitting laser as defined in claim 1 wherein the oscillation wavelength of the surface-emitted laser light is within a range of 510~550 nm.

11. A surface emitting laser as defined in claim 1 wherein:
    said semiconductor substrate has a rear surface and a concave part, the concave part being an etched portion of the substrate at the rear surface, up to a position near the surface of the active layer.

12. A semiconductor laser device comprising a semiconductor laser for emitting laser light, and a wavelength conversion element for converting the wavelength of the laser light emitted from the semiconductor laser,
    said semiconductor laser being the surface emitting laser defined in claim 1.

13. A laser module obtained by integrating plural semiconductor lasers in a single package,
    each of the plural semiconductor lasers being the surface emitting laser defined in claim 1.

14. A laser module as defined in claim 13 wherein said plural semiconductor lasers are arranged so that each semiconductor laser is positioned at an apex of a regular polygon the center of which matches the center of the package.

15. A laser projector comprising a semiconductor laser for emitting laser light, and a projection optical system for projecting the laser light emitted from the semiconductor laser,
    said semiconductor laser being the surface emitting laser defined in claim 1.

16. A laser projector as defined in claim 15 wherein said surface emitting laser emits laser light in which a vertical mode spectrum is in a multimode.

17. A laser projector as defined in claim 15 wherein said surface emitting laser emits laser light in which the substantial width of a vertical mode spectrum is 1 nm or more.

18. A surface emitting laser for performing surface emission of laser light, comprising:
    a semiconductor layer laminated body including an active layer, a semiconductor substrate and a plurality of semiconductor layers laminated on the semiconductor substrate;
    a pair of electrodes for injecting carriers into the active layer, one of said electrodes comprising a single electrode layer having a center portion and a peripheral portion, and said one electrode being configured to inject current into the active layer, such that current densities for the center portion and for the peripheral portion are different;
    a resistive layer disposed between the semiconductor layer laminated body and the electrode layer, the resistive layer including a first portion adjacent the center portion and a second portion adjacent the peripheral portion, a resistance value of the first portion being different from a resistance value of the second portion; and
    a plurality of fine holes disposed in the resistive layer, such that an occupation density of the fine holes disposed in the center portion is different than an occupation density of fine holes disposed in the peripheral portion.

* * * * *